US012730164B2

(12) United States Patent
Kim et al.

(10) Patent No.: US 12,730,164 B2
(45) **Date of Patent: *Sep. 8, 2026**

(54) REFRIGERATOR WITH AUTOMATIC DOOR AND METHOD FOR CONTROLLING AUTOMATIC DOOR OF REFRIGERATOR

(71) Applicant: LG Electronics Inc., Seoul (KR)

(72) Inventors: Hyunbum Kim, Seoul (KR); Seungyoon Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 379 days.

This patent is subject to a terminal disclaimer.

(21) Appl. No.: 18/276,575

(22) PCT Filed: Feb. 8, 2022

(86) PCT No.: PCT/KR2022/001894

§ 371 (c)(1),
(2) Date: Aug. 9, 2023

(87) PCT Pub. No.: WO2022/173186

PCT Pub. Date: Aug. 18, 2022

(65) Prior Publication Data

US 2024/0110744 A1 Apr. 4, 2024

(30) Foreign Application Priority Data

Feb. 9, 2021 (KR) ........................ 10-2021-0018421

(51) Int. Cl.
*G01R 33/038* (2006.01)
*E05F 15/616* (2015.01)
(Continued)

(52) U.S. Cl.
CPC ........ *G01R 33/072* (2013.01); *E05Y 2900/31* (2013.01); *F25D 23/02* (2013.01); *F25D 23/028* (2013.01); *F25D 2700/02* (2013.01)

(58) Field of Classification Search
CPC ..... G01R 33/072; G01R 33/038; F25D 23/02; F25D 23/028; F25D 2700/02;
(Continued)

(56) References Cited

U.S. PATENT DOCUMENTS

2013/0104590 A1* 5/2013 Seo ......................... F25D 23/04 312/405.1
2016/0327328 A1* 11/2016 Jeong .................... F25D 23/065
(Continued)

FOREIGN PATENT DOCUMENTS

JP 2010025461 2/2010
KR 0113420 4/1998
(Continued)

*Primary Examiner* — Kamini S Shah
*Assistant Examiner* — Michael V Farina
(74) *Attorney, Agent, or Firm* — Fish & Richardson P.C.

(57) ABSTRACT

A refrigerator includes: a sensor comprising a magnetic field sensor and a magnet and configured to detect an open or closed state of the door and measure a pressed amount of the door based on a change in a distance between the magnetic field sensor and the magnet, and a controller configured to control a door driver and determine whether the door is to be opened based on the pressed amount of the door. The controller is configured to determine whether the door is to be opened by comparing (i) a difference between an output voltage and a threshold value with (ii) a substituted operation determination value, where the difference between the output voltage and the threshold value is compared with the operation determination value to determine, based on the operation determination value being equal to or greater than a determination lower limit, whether the door is to be opened.

19 Claims, 27 Drawing Sheets

(51) Int. Cl.
*G01R 33/07* (2006.01)
*F25D 23/02* (2006.01)

(58) Field of Classification Search
CPC ............. F25D 29/005; E05Y 2201/426; E05Y 2900/31; E05F 15/616
USPC .......................................................... 700/302
See application file for complete search history.

(56) References Cited

U.S. PATENT DOCUMENTS

| | | | | |
|---|---|---|---|---|
| 2017/0089632 | A1* | 3/2017 | Kang | G06F 1/1677 |
| 2018/0347892 | A1* | 12/2018 | Kim | E05F 15/619 |
| 2022/0107207 | A1* | 4/2022 | Suyderhoud | G01D 5/145 |
| 2023/0266049 | A1* | 8/2023 | Blackmore | G01D 18/006 49/381 |

FOREIGN PATENT DOCUMENTS

| | | | | |
|---|---|---|---|---|
| KR | 10-2018-0080080 | | 7/2018 | |
| KR | 10-2018-0132390 | | 12/2018 | |
| TR | 201708697 | A2 * | 1/2019 | F25D 23/028 |
| WO | WO 2018228815 | | 12/2018 | |

* cited by examiner

[Fig. 1]
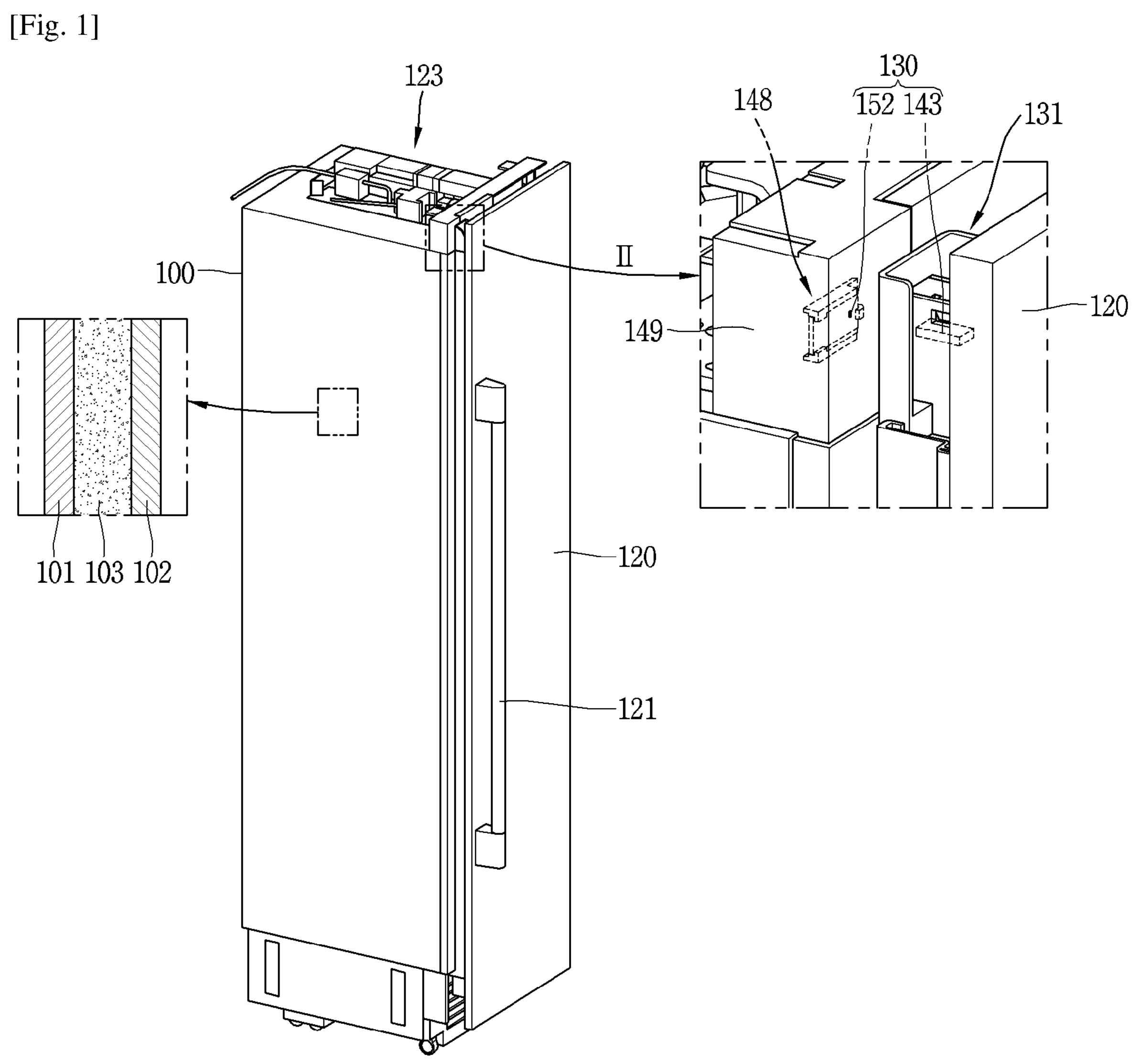

[Fig. 2]
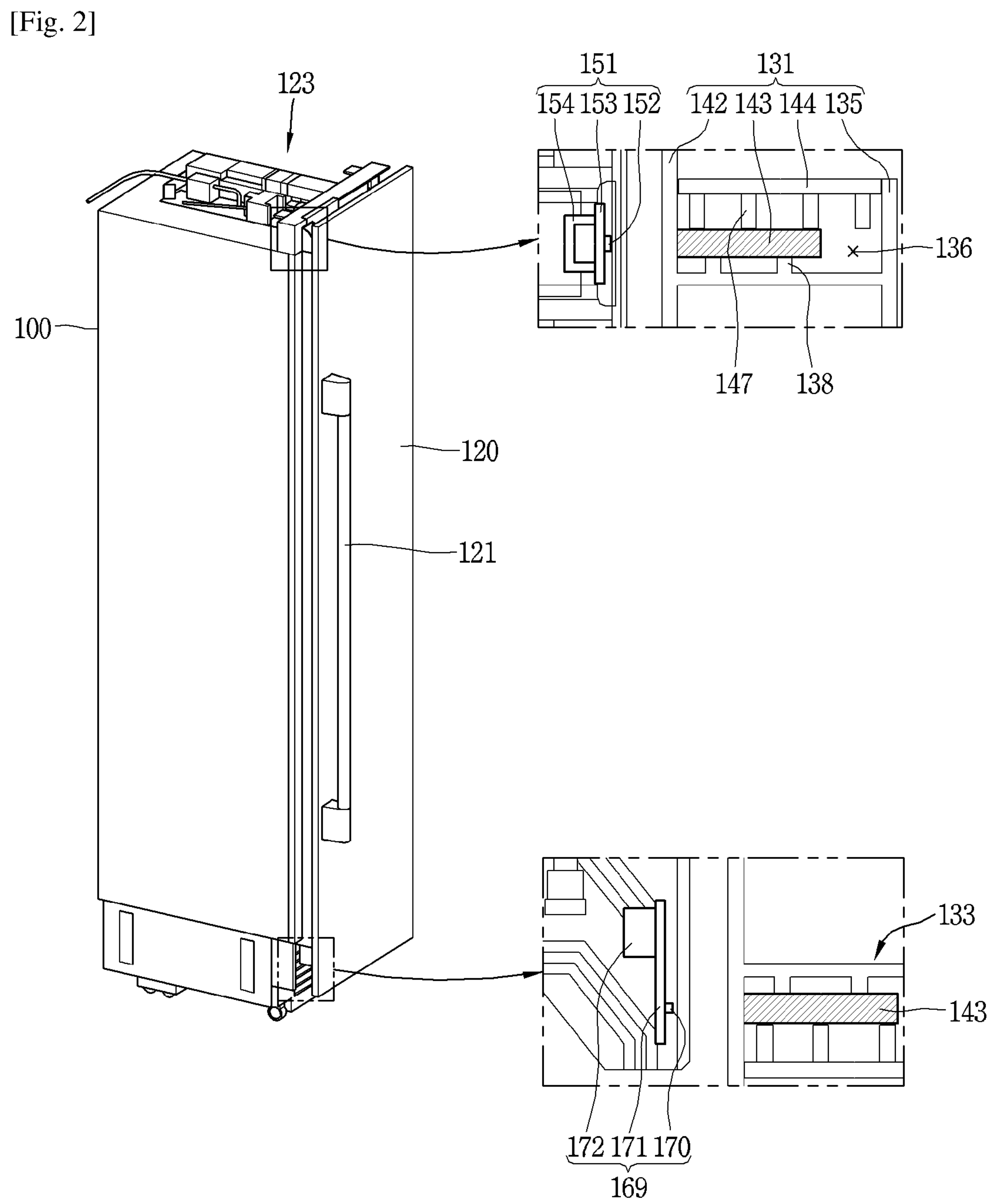

[Fig. 3]
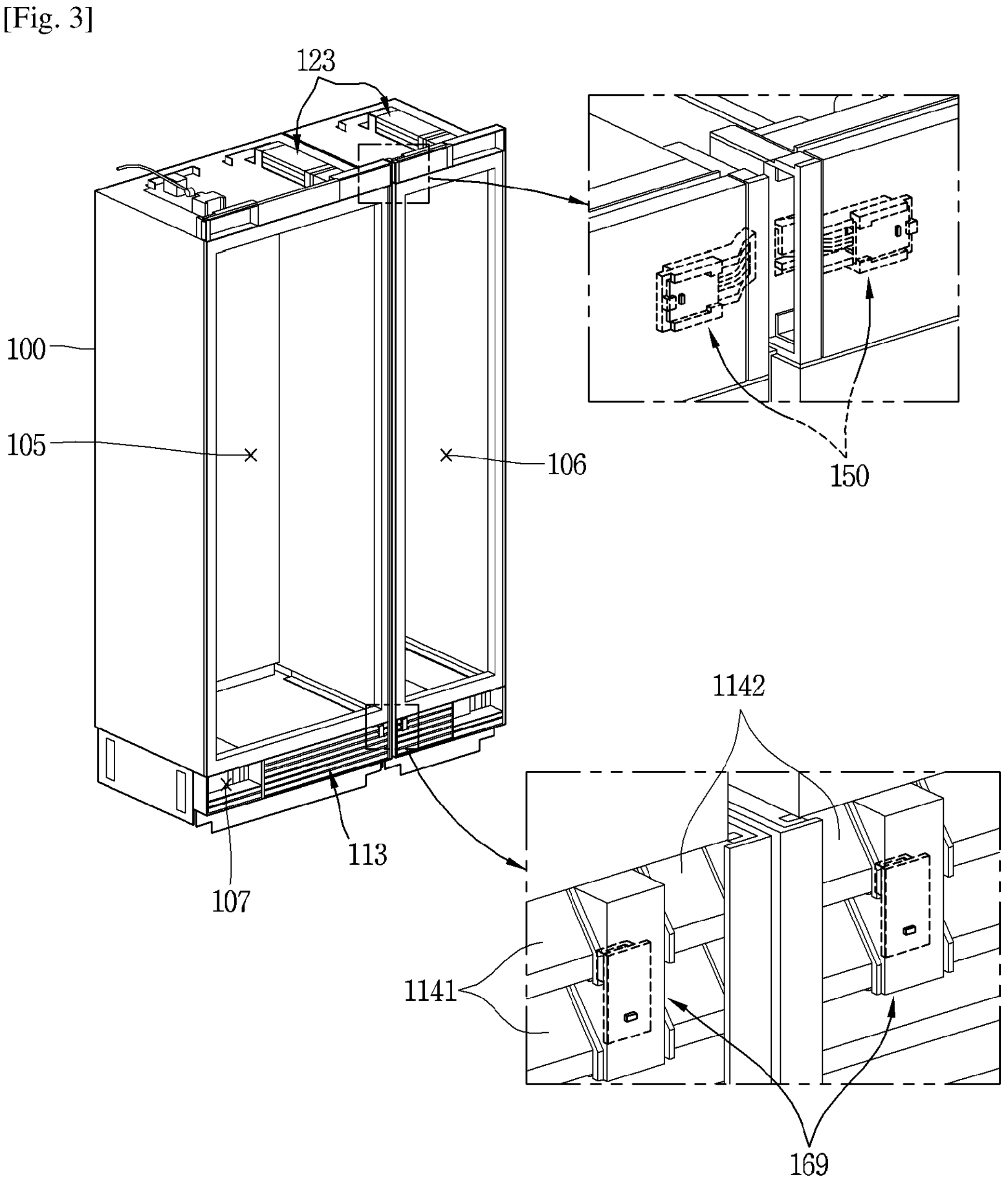

[Fig. 4]
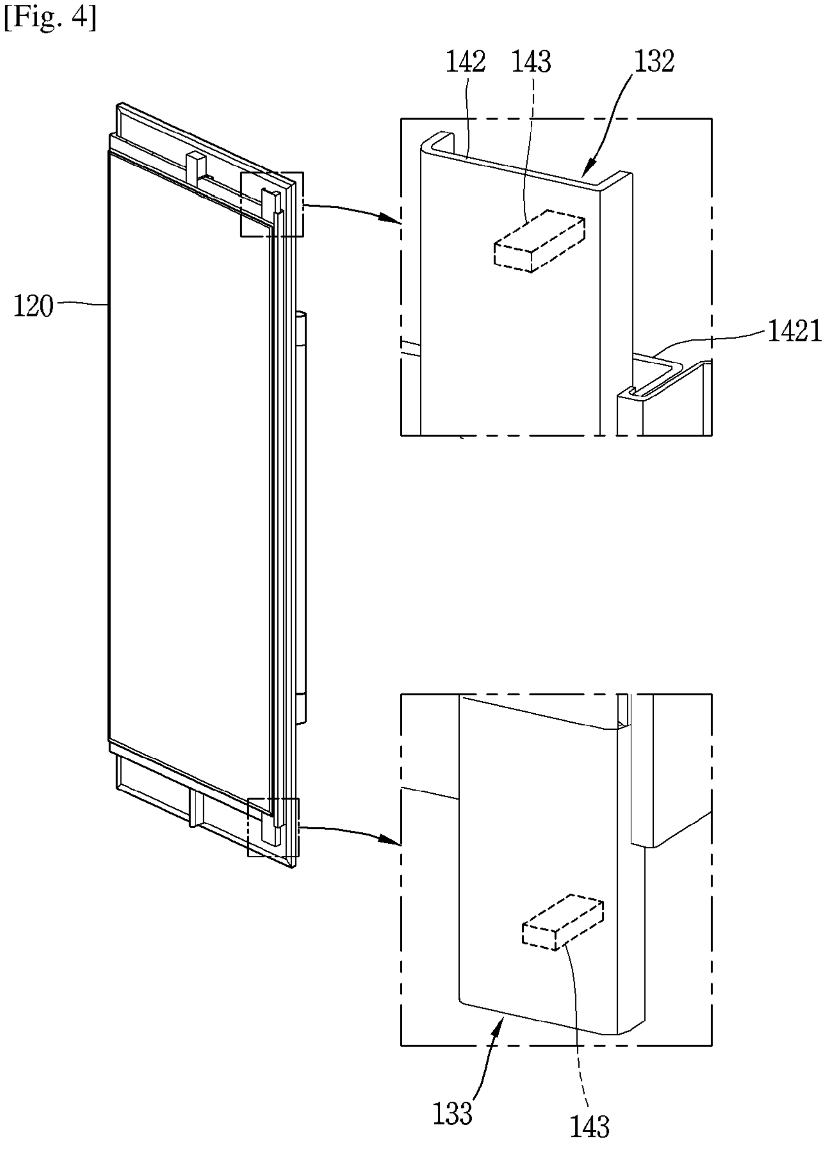

[Fig. 7]
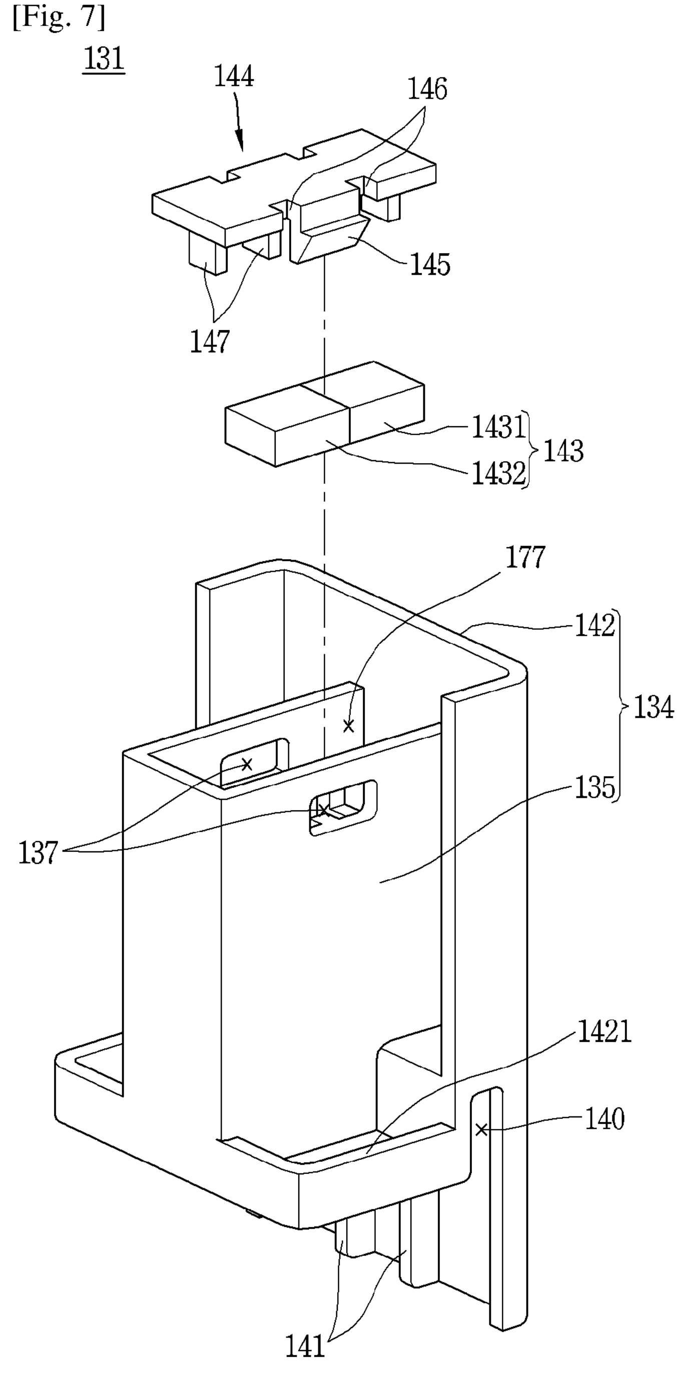

[Fig. 8]
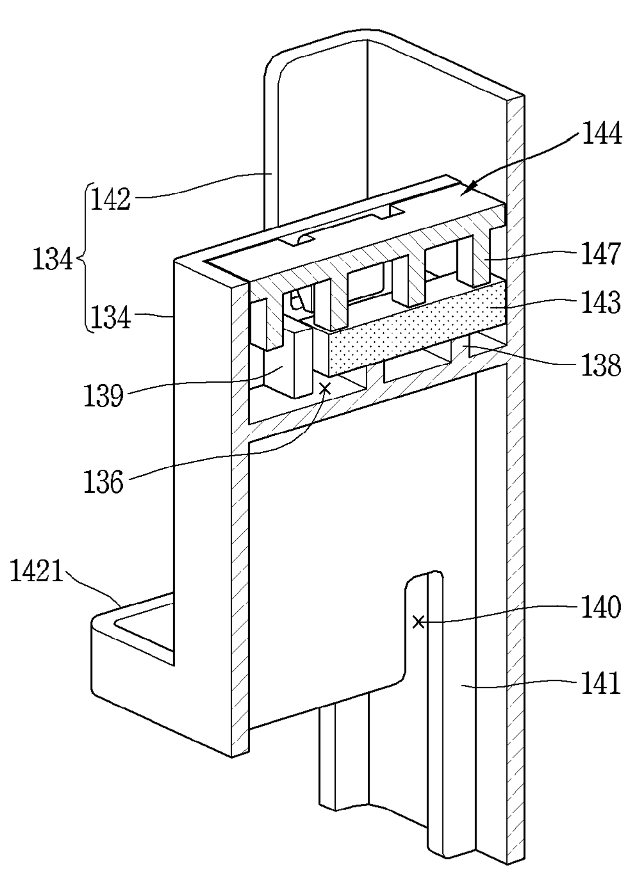

[Fig. 9]
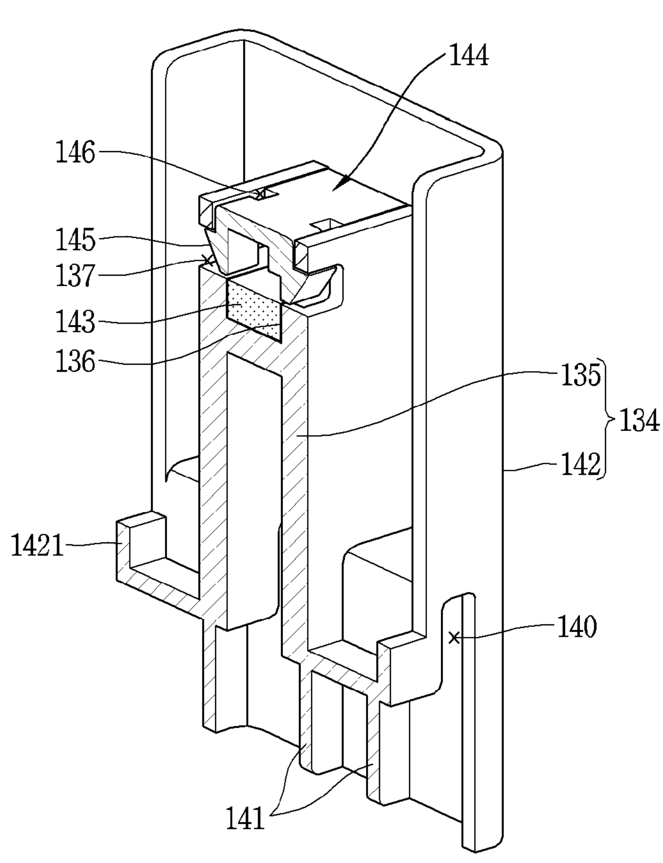

[Fig. 10]
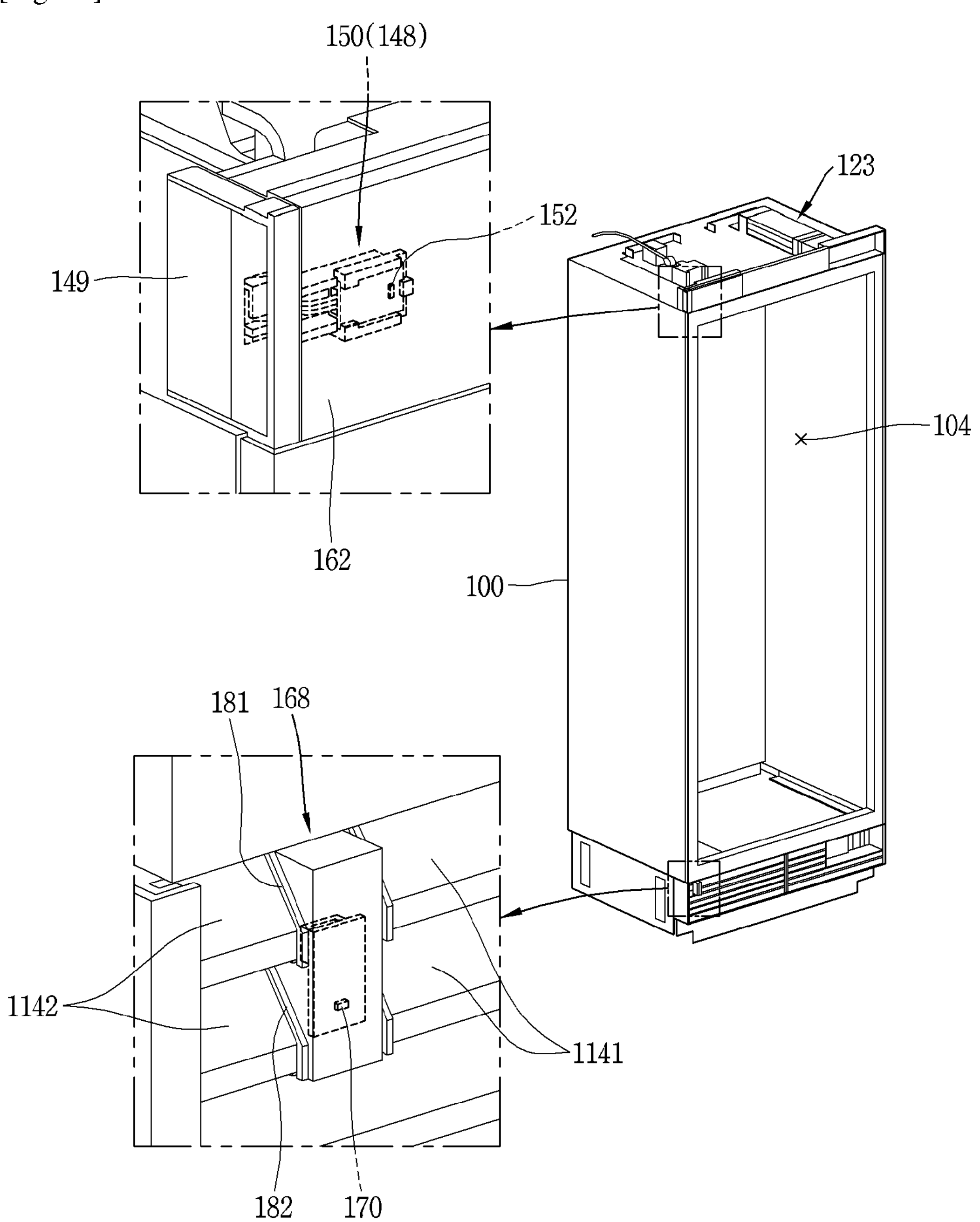

[Fig. 11]
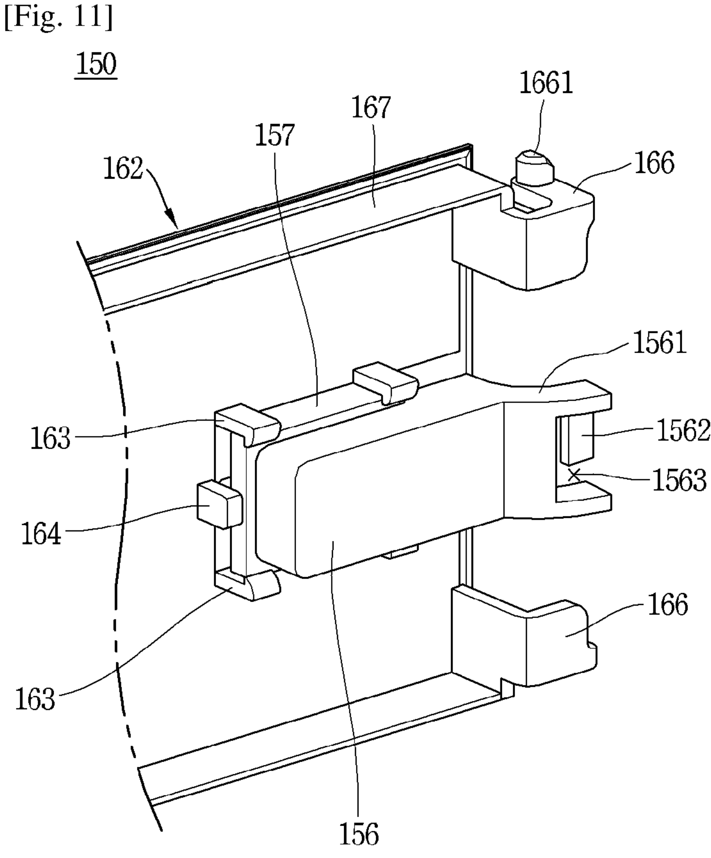
[Fig. 12]
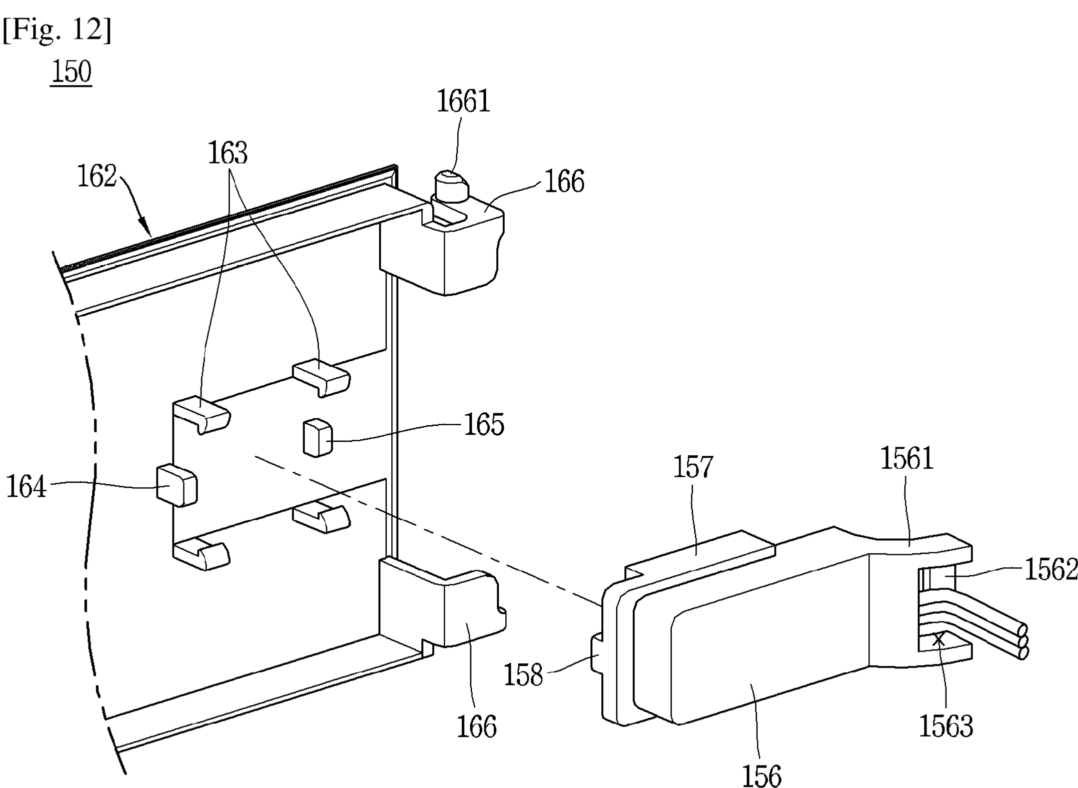

[Fig. 13]
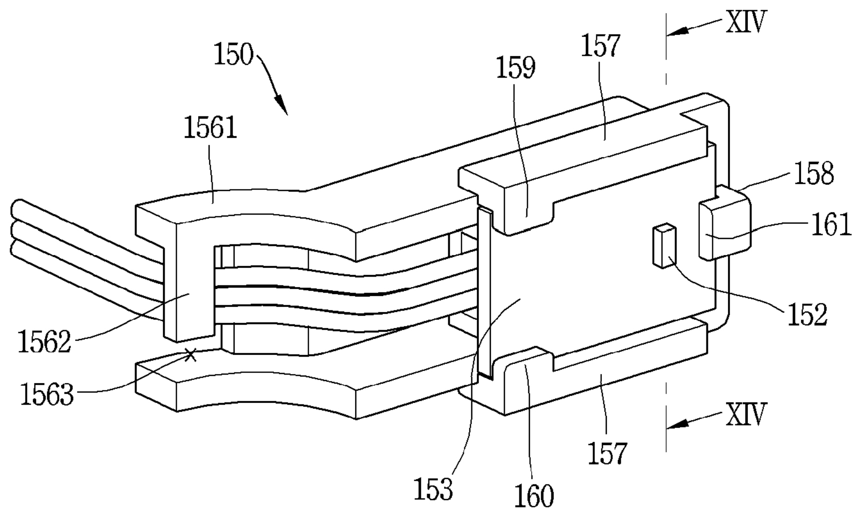
[Fig. 14]
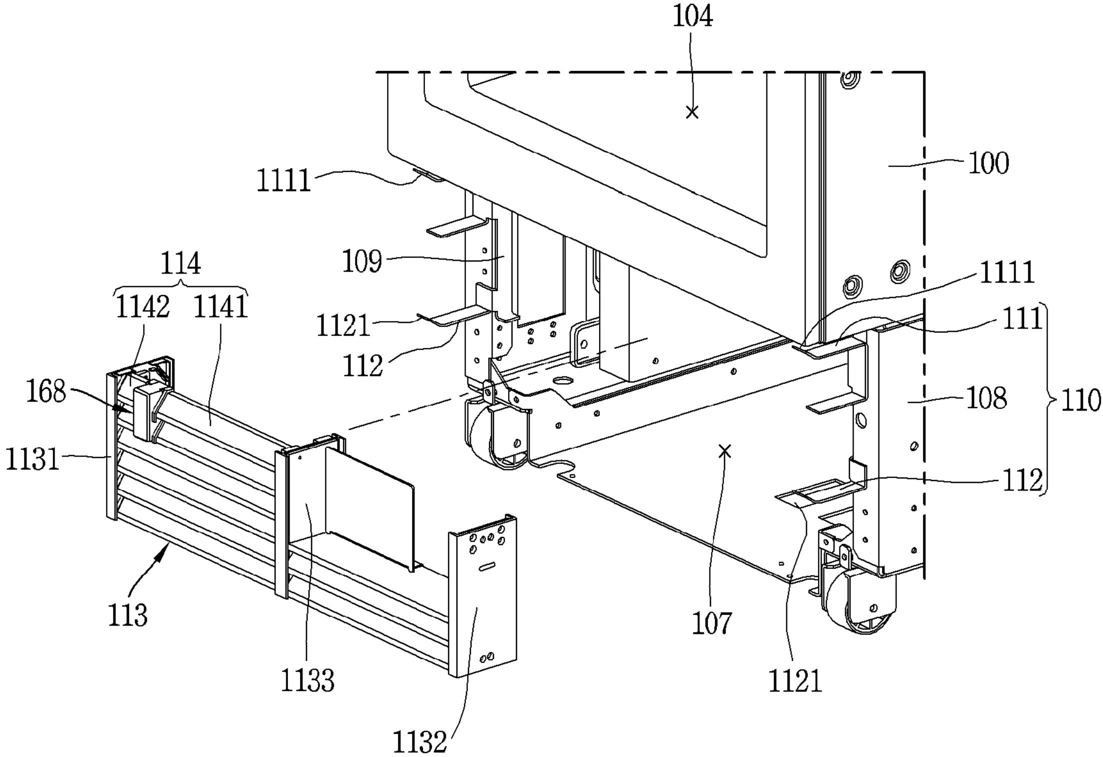

[Fig. 15]
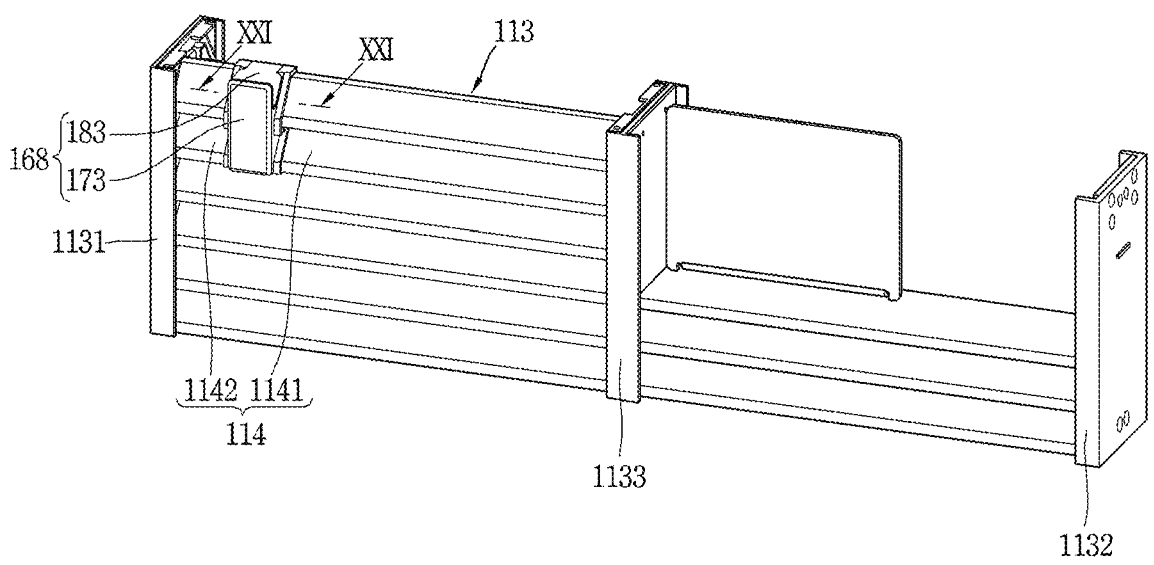
[Fig. 16]
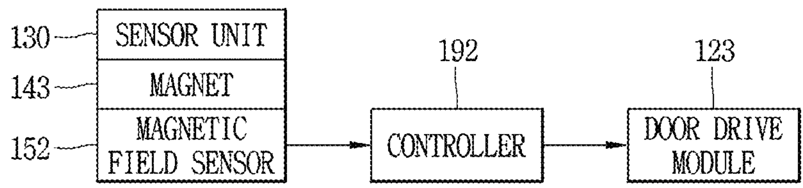

[Fig. 17]
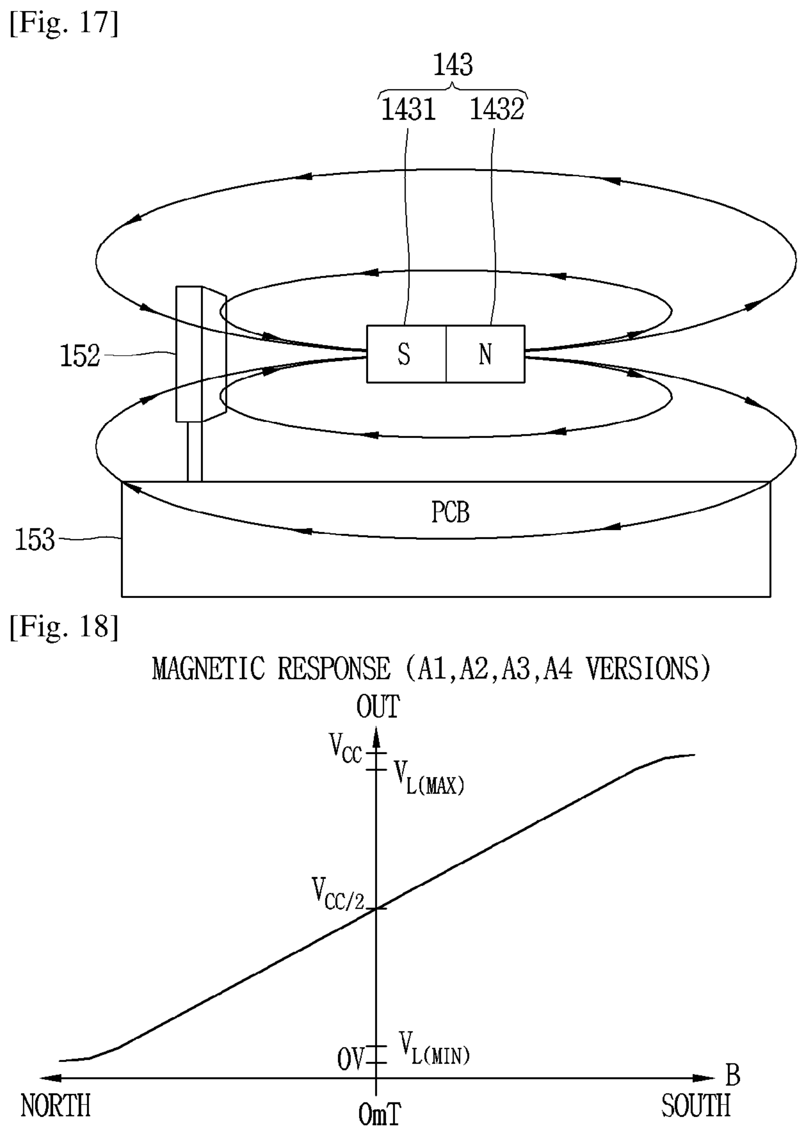
[Fig. 18]

[Fig. 19]
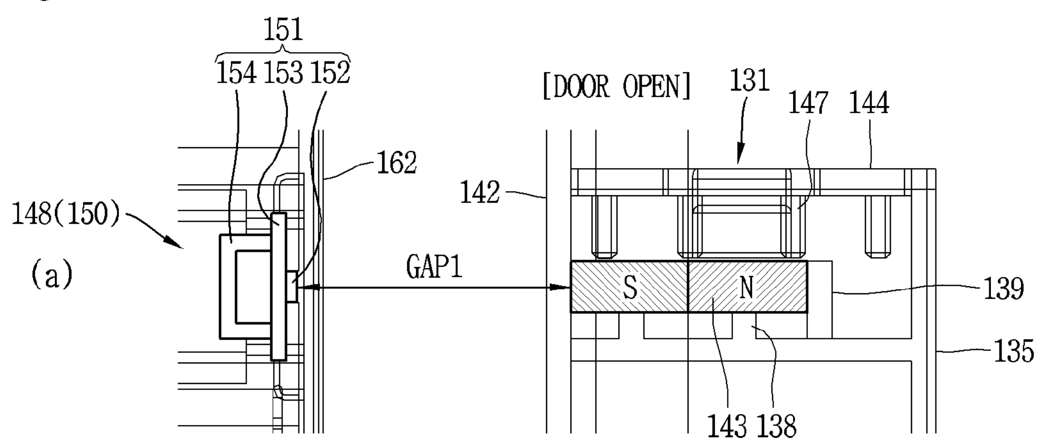
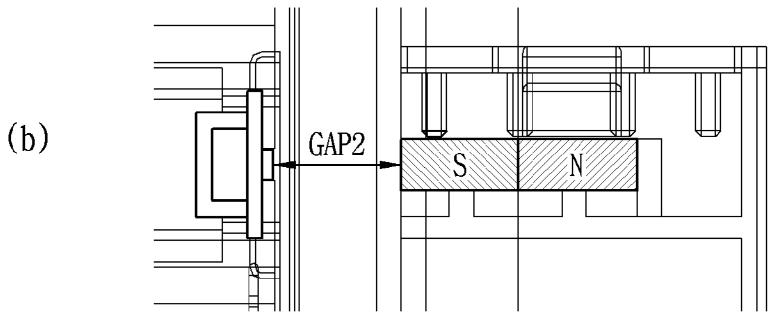
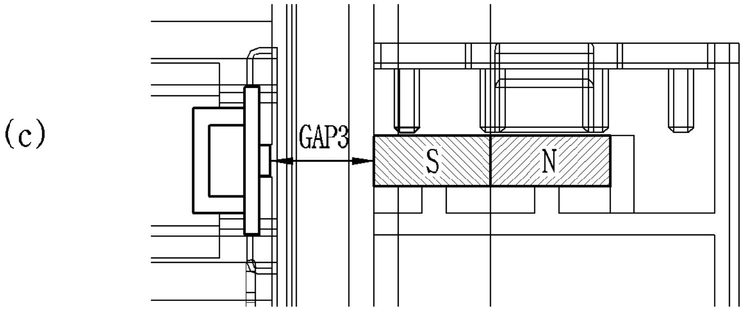

[Fig. 20]
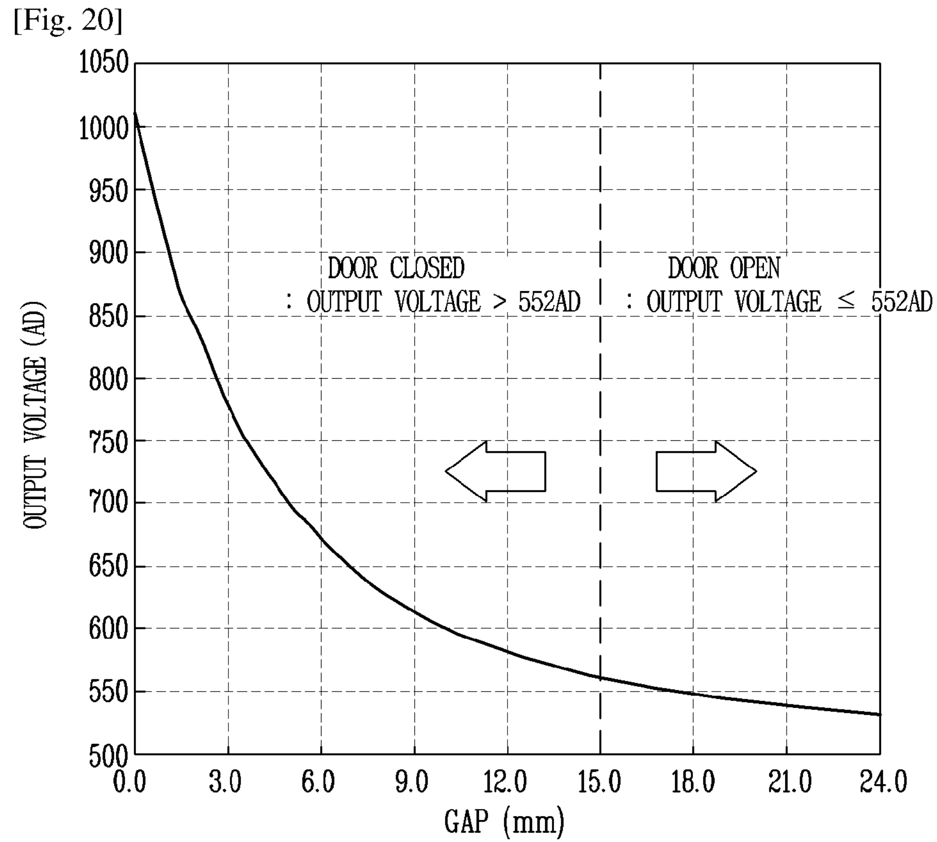

[Fig. 21]
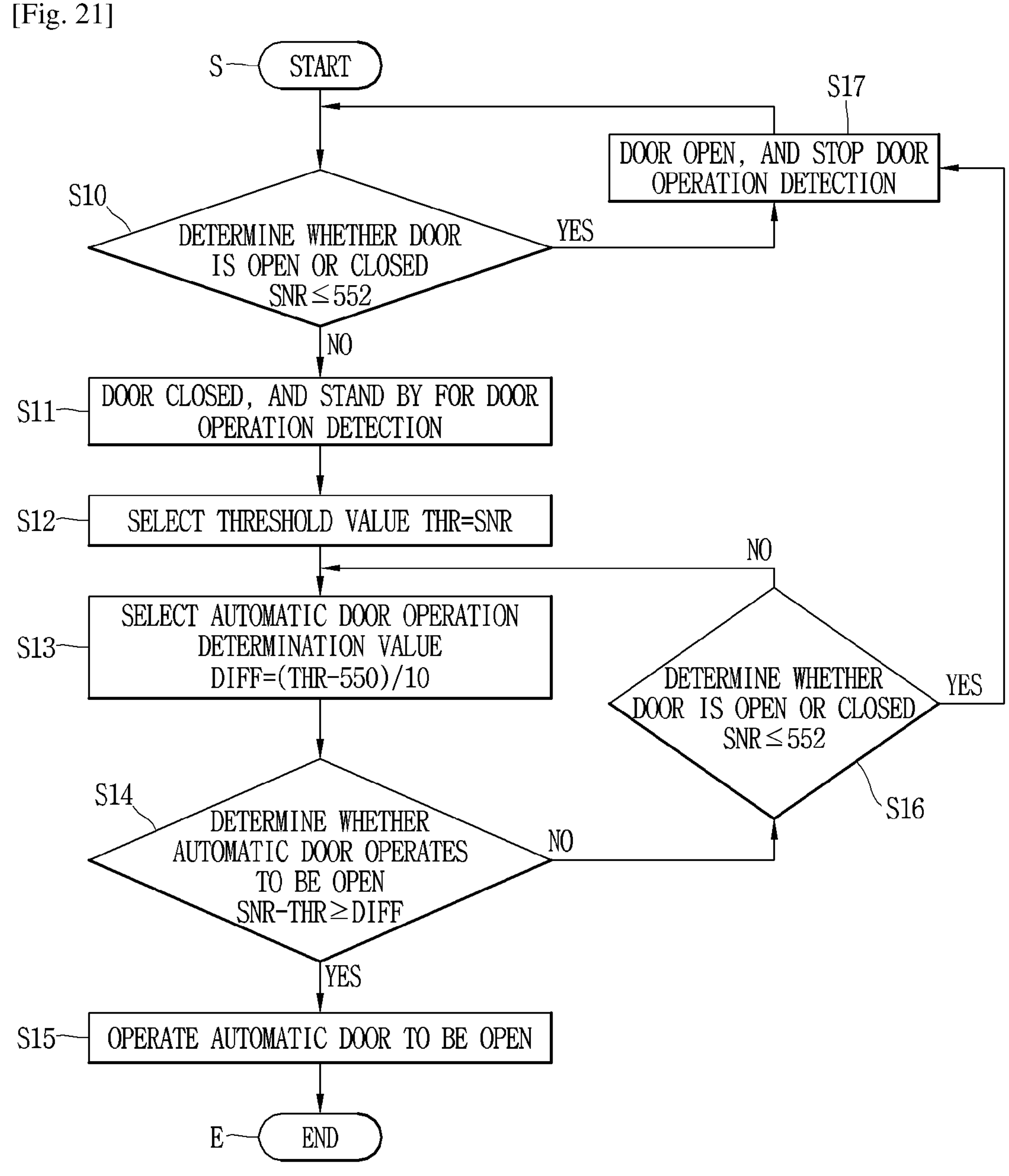

[Fig. 22]
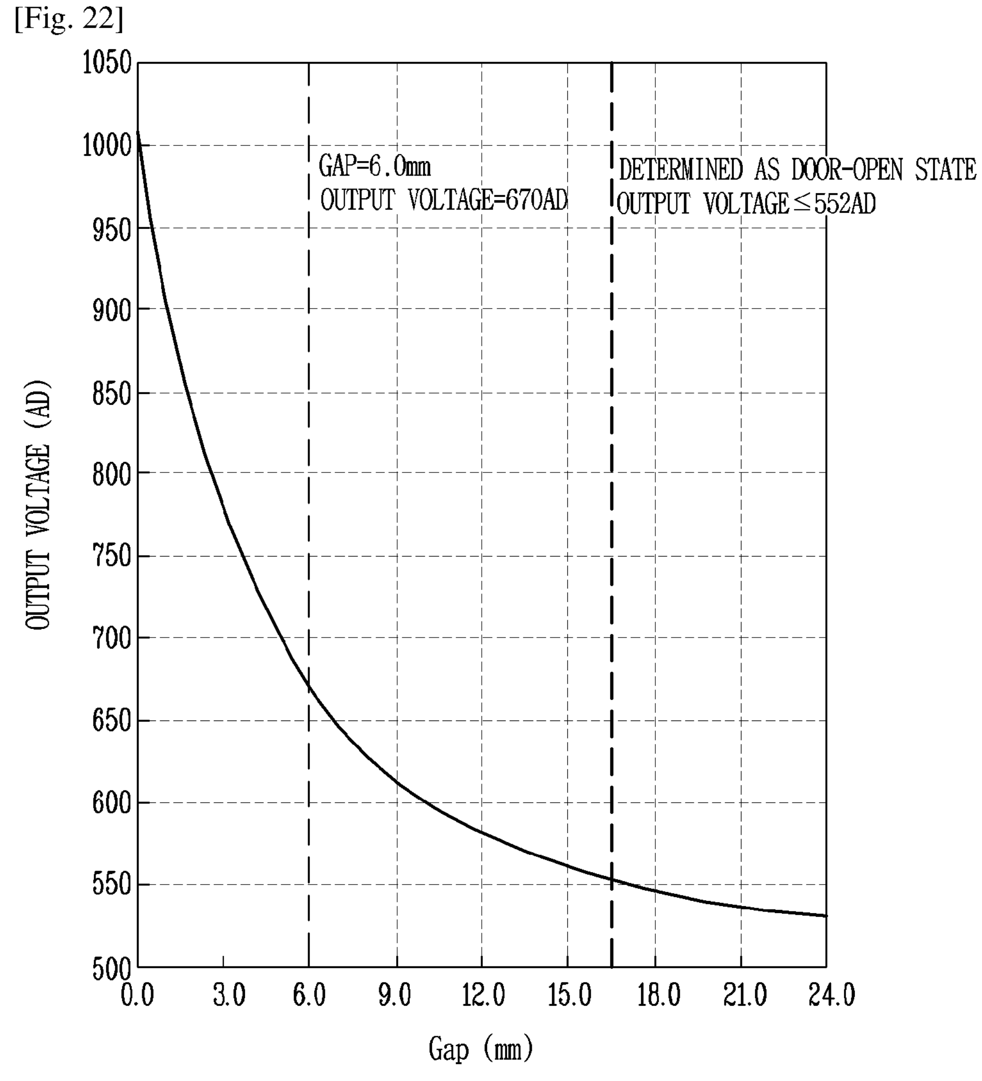

[Fig. 23]
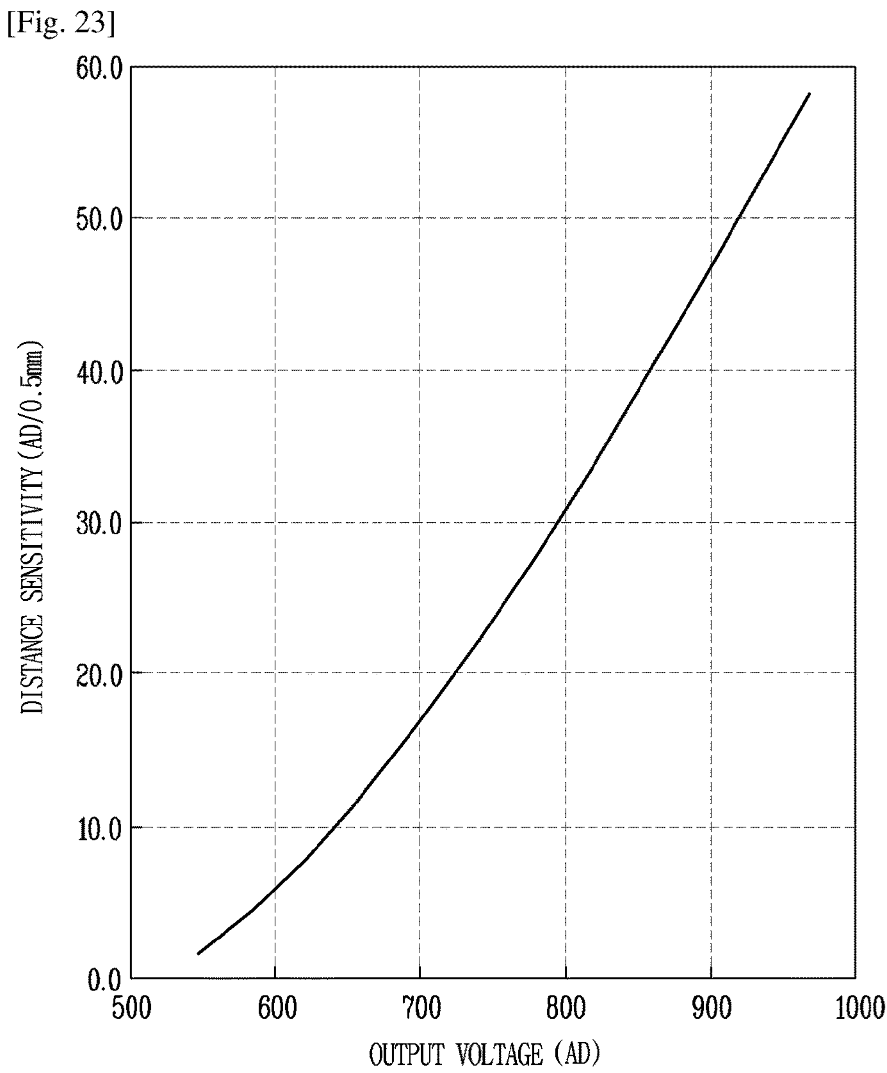
[Fig. 24]
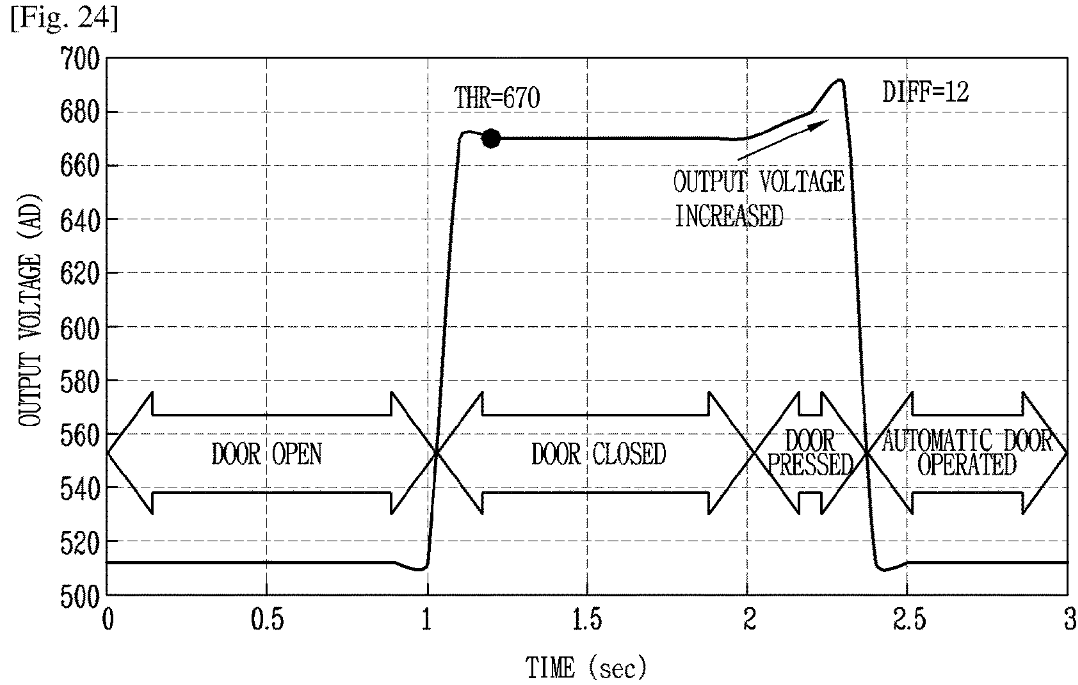

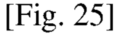
[Fig. 25]
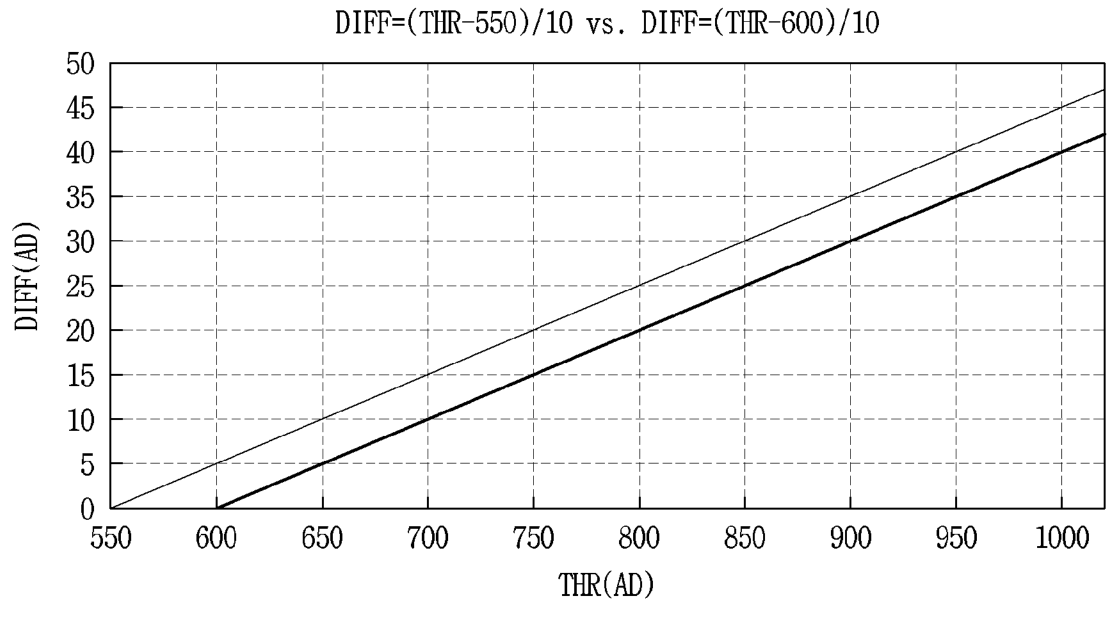
[Fig. 26]
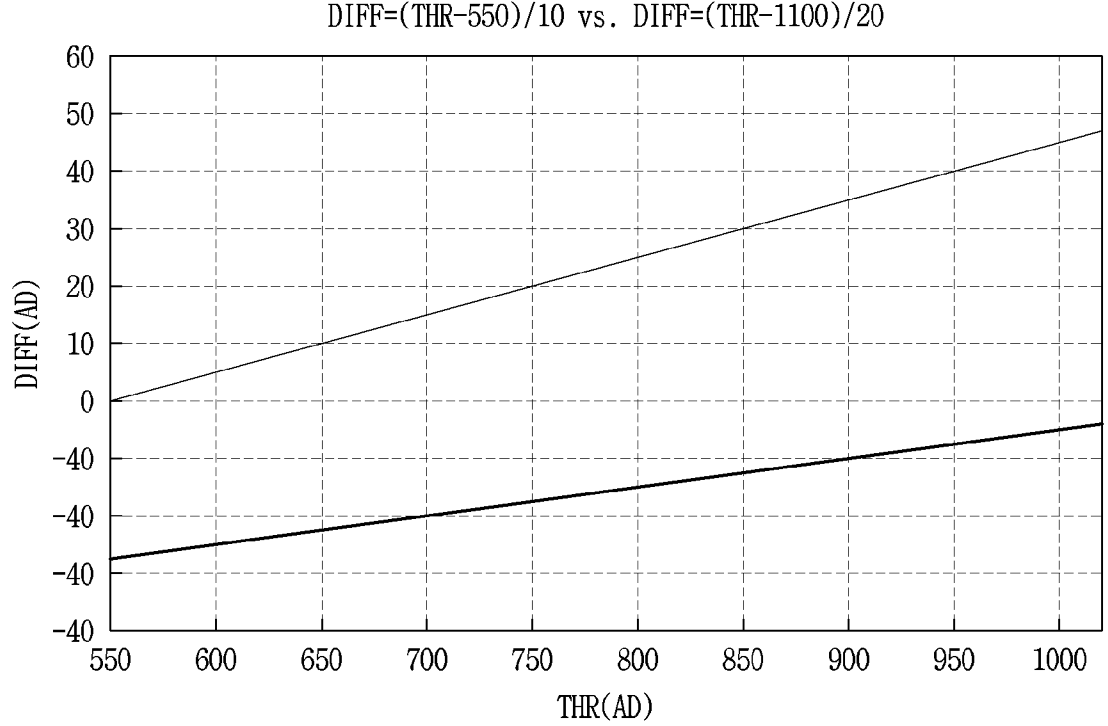

[Fig. 27]

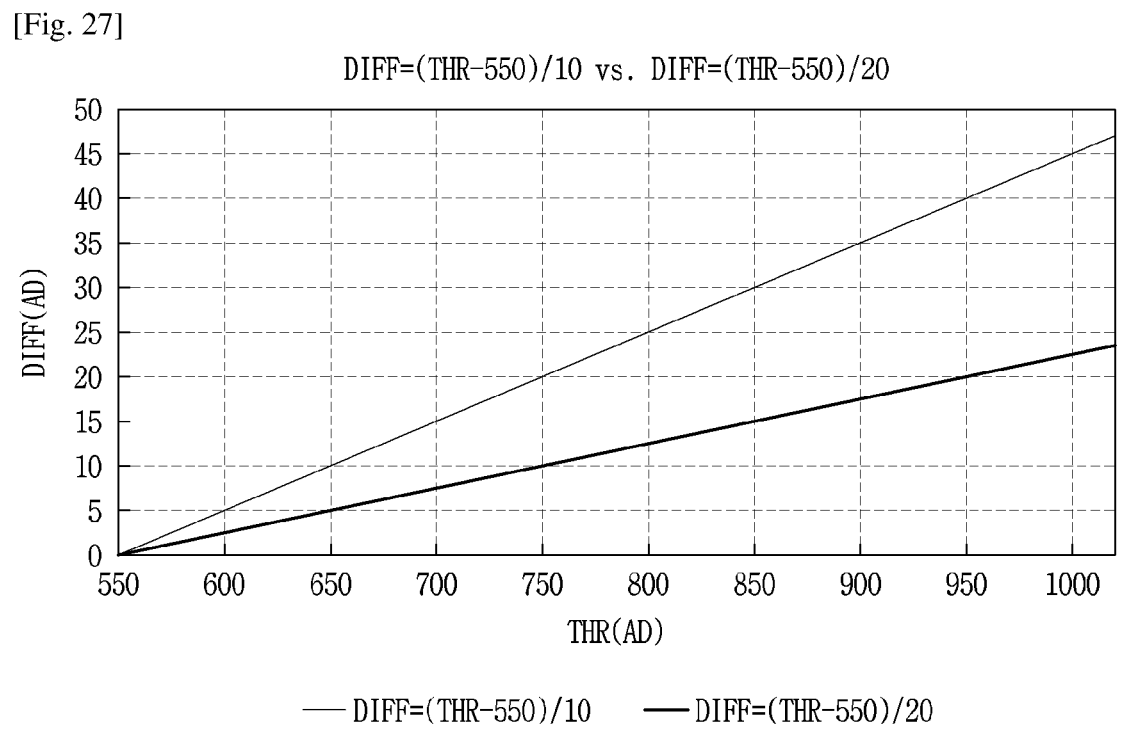

DIFF=(THR-550)/10 vs. DIFF=(THR-550)/20

DIFF(AD)

50
45
40
35
30
25
20
15
10
5
0

550 600 650 700 750 800 850 900 950 1000

THR(AD)

DIFF=(THR-550)/10
DIFF=(THR-550)/20

[Fig. 28]
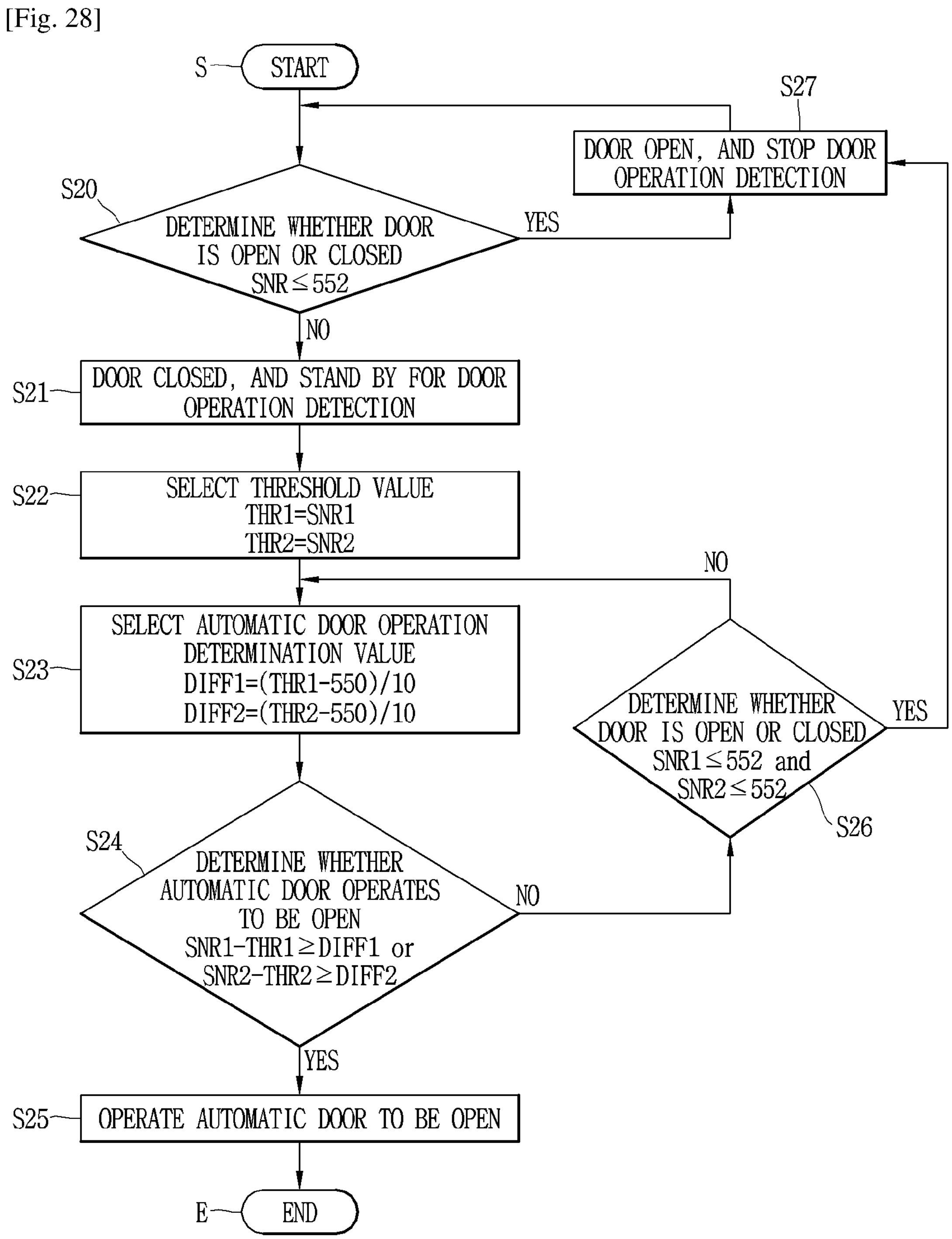

[Fig. 29]

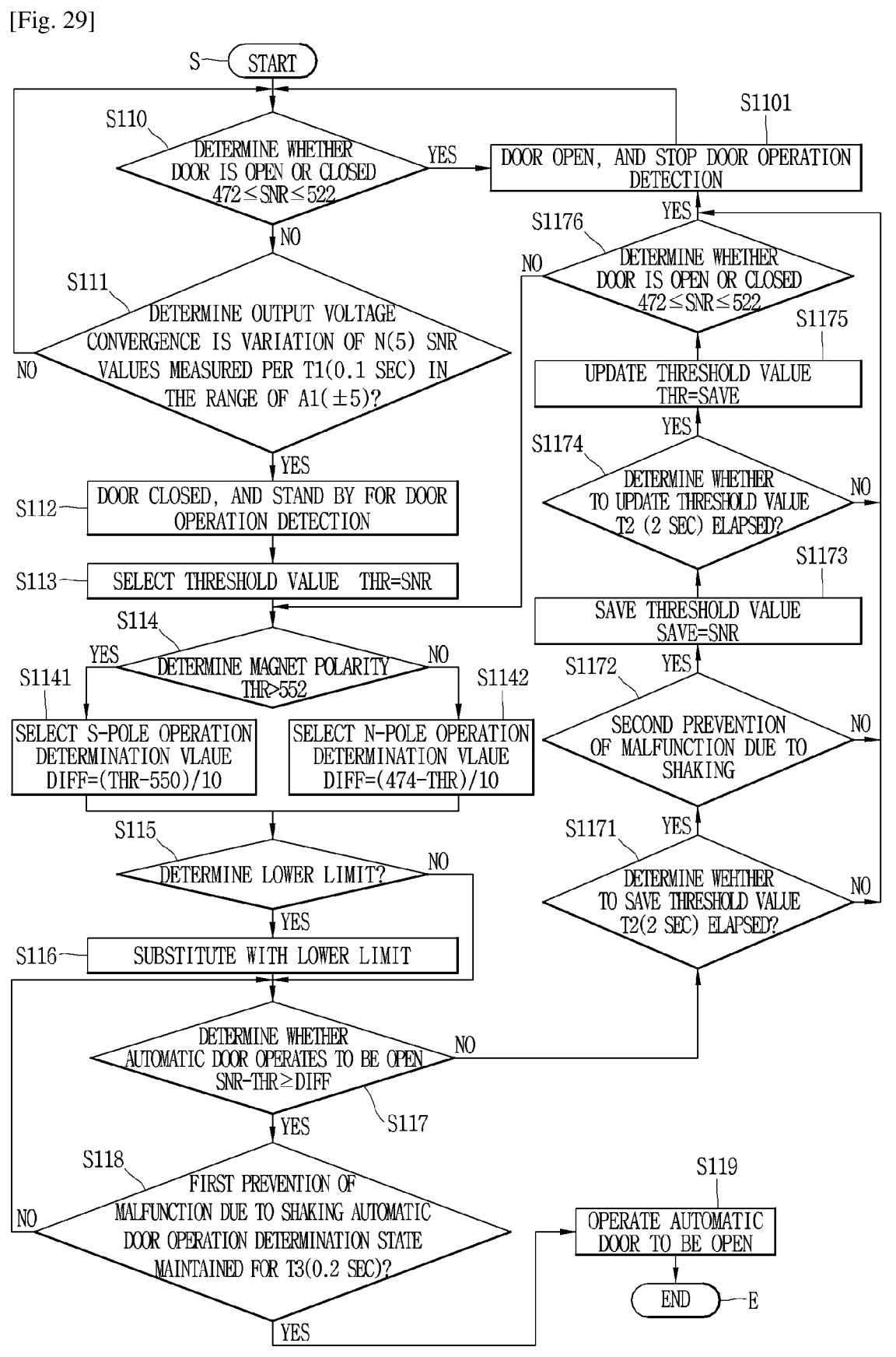

S START

S110 DETERMINE WHETHER DOOR IS OPEN OR CLOSED 472≤SNR≤522

YES

S1101 DOOR OPEN, AND STOP DOOR OPERATION DETECTION

NO

S111 DETERMINE OUTPUT VOLTAGE CONVERGENCE IS VARIATION OF N(5) SNR VALUES MEASURED PER T1(0.1 SEC) IN THE RANGE OF A1(±5)?

NO

YES

S112 DOOR CLOSED, AND STAND BY FOR DOOR OPERATION DETECTION

S113 SELECT THRESHOLD VALUE THR=SNR

S114 DETERMINE MAGNET POLARITY THR>552

YES NO

S1141 SELECT S-POLE OPERATION DETERMINATION VLAUE DIFF=(THR-550)/10

S1142 SELECT N-POLE OPERATION DETERMINATION VLAUE DIFF=(474-THR)/10

S115 DETERMINE LOWER LIMIT?

NO

YES

S116 SUBSTITUTE WITH LOWER LIMIT

S117 DETERMINE WHETHER AUTOMATIC DOOR OPERATES TO BE OPEN SNR-THR≥DIFF

NO

YES

S118 FIRST PREVENTION OF MALFUNCTION DUE TO SHAKING AUTOMATIC DOOR OPERATION DETERMINATION STATE MAINTAINED FOR T3(0.2 SEC)?

NO

YES

S119 OPERATE AUTOMATIC DOOR TO BE OPEN

END E

S1171 DETERMINE WEHTHER TO SAVE THRESHOLD VALUE T2(2 SEC) ELAPSED?

YES NO

S1172 SECOND PREVENTION OF MALFUNCTION DUE TO SHAKING

YES NO

S1173 SAVE THRESHOLD VALUE SAVE=SNR

S1174 DETERMINE WHETHER TO UPDATE THRESHOLD VALUE T2 (2 SEC) ELAPSED?

YES NO

S1175 UPDATE THRESHOLD VALUE THR=SAVE

S1176 DETERMINE WHETHER DOOR IS OPEN OR CLOSED 472≤SNR≤522

YES NO

[Fig. 30]
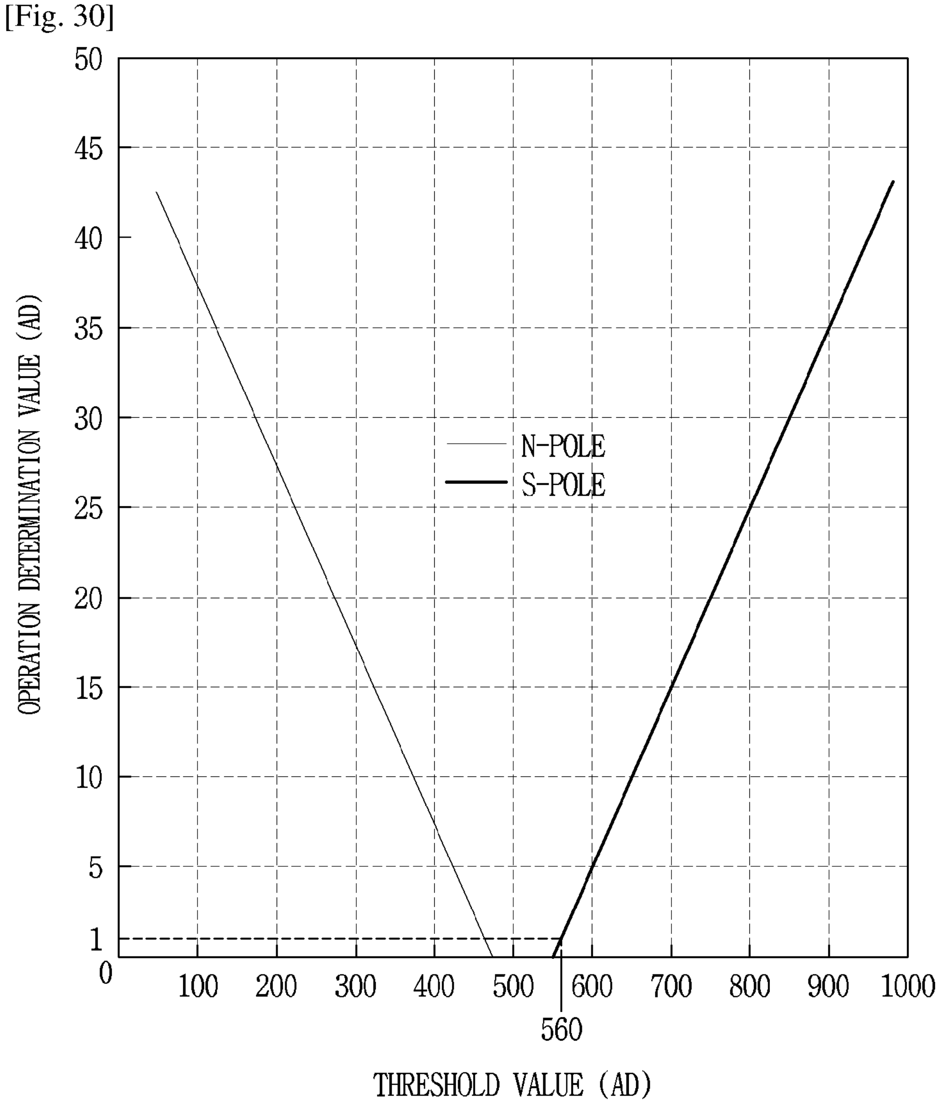

[Fig. 31]
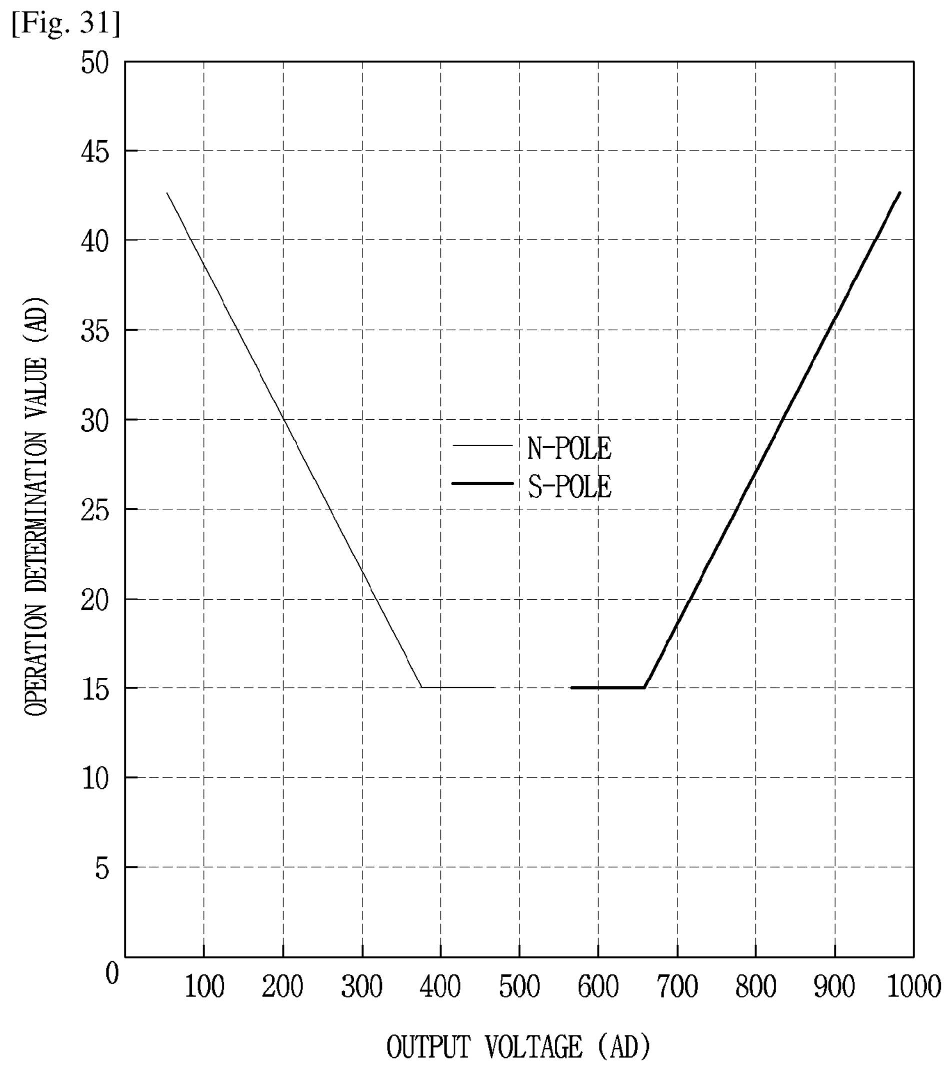

[Fig. 32]

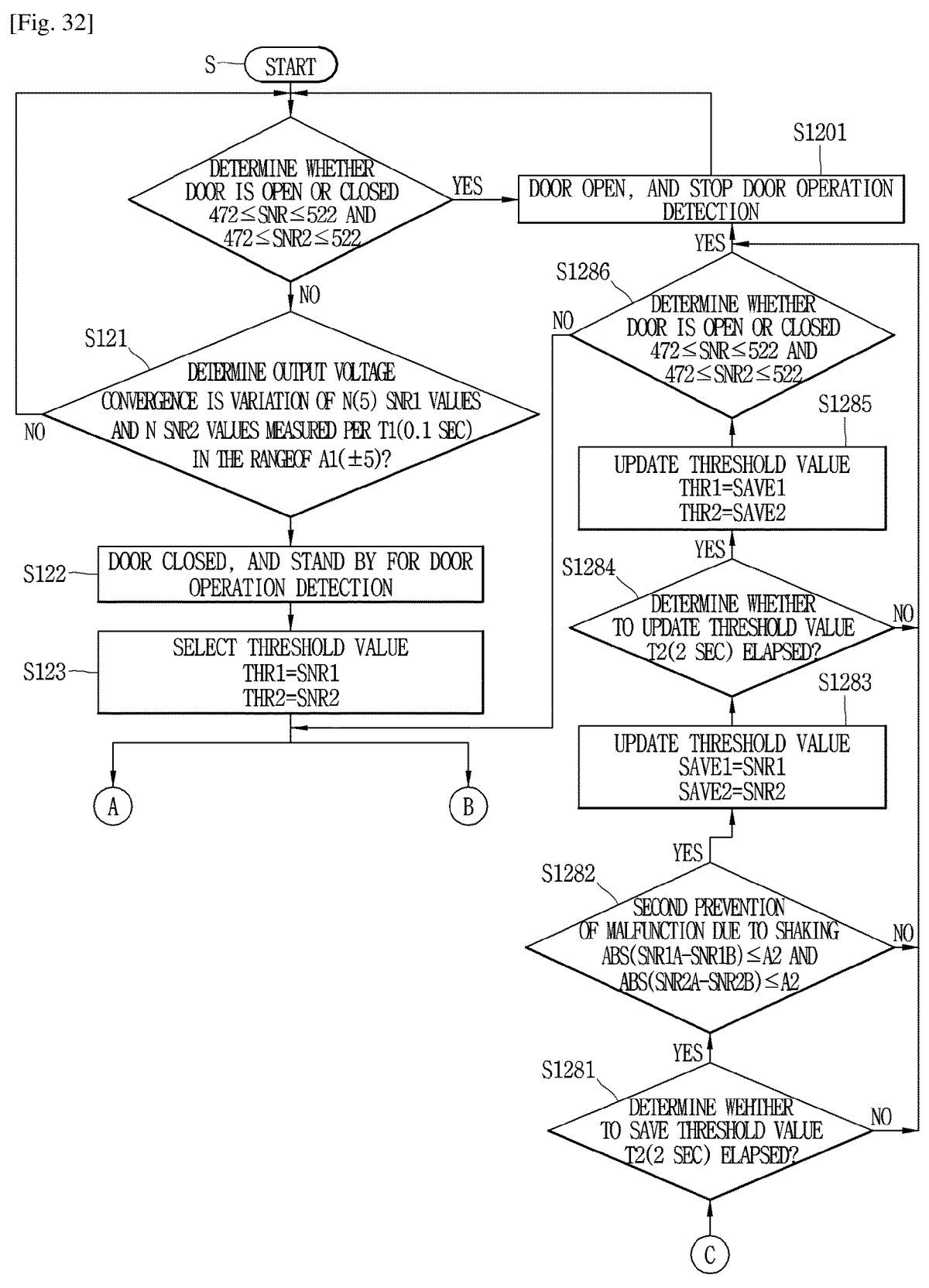

S START

DETERMINE WHETHER DOOR IS OPEN OR CLOSED 472≤SNR≤522 AND 472≤SNR2≤522

YES

S1201 DOOR OPEN, AND STOP DOOR OPERATION DETECTION

NO

S121 DETERMINE OUTPUT VOLTAGE CONVERGENCE IS VARIATION OF N(5) SNR1 VALUES AND N SNR2 VALUES MEASURED PER T1(0.1 SEC) IN THE RANGEOF A1(±5)?

NO

S122 DOOR CLOSED, AND STAND BY FOR DOOR OPERATION DETECTION

S123 SELECT THRESHOLD VALUE THR1=SNR1 THR2=SNR2

A

B

S1286 DETERMINE WHETHER DOOR IS OPEN OR CLOSED 472≤SNR≤522 AND 472≤SNR2≤522

YES

NO

S1285 UPDATE THRESHOLD VALUE THR1=SAVE1 THR2=SAVE2

YES

S1284 DETERMINE WHETHER TO UPDATE THRESHOLD VALUE T2(2 SEC) ELAPSED?

NO

S1283 UPDATE THRESHOLD VALUE SAVE1=SNR1 SAVE2=SNR2

YES

S1282 SECOND PREVENTION OF MALFUNCTION DUE TO SHAKING ABS(SNR1A-SNR1B)≤A2 AND ABS(SNR2A-SNR2B)≤A2

NO

YES

S1281 DETERMINE WEHTHER TO SAVE THRESHOLD VALUE T2(2 SEC) ELAPSED?

NO

C

[Fig. 33]
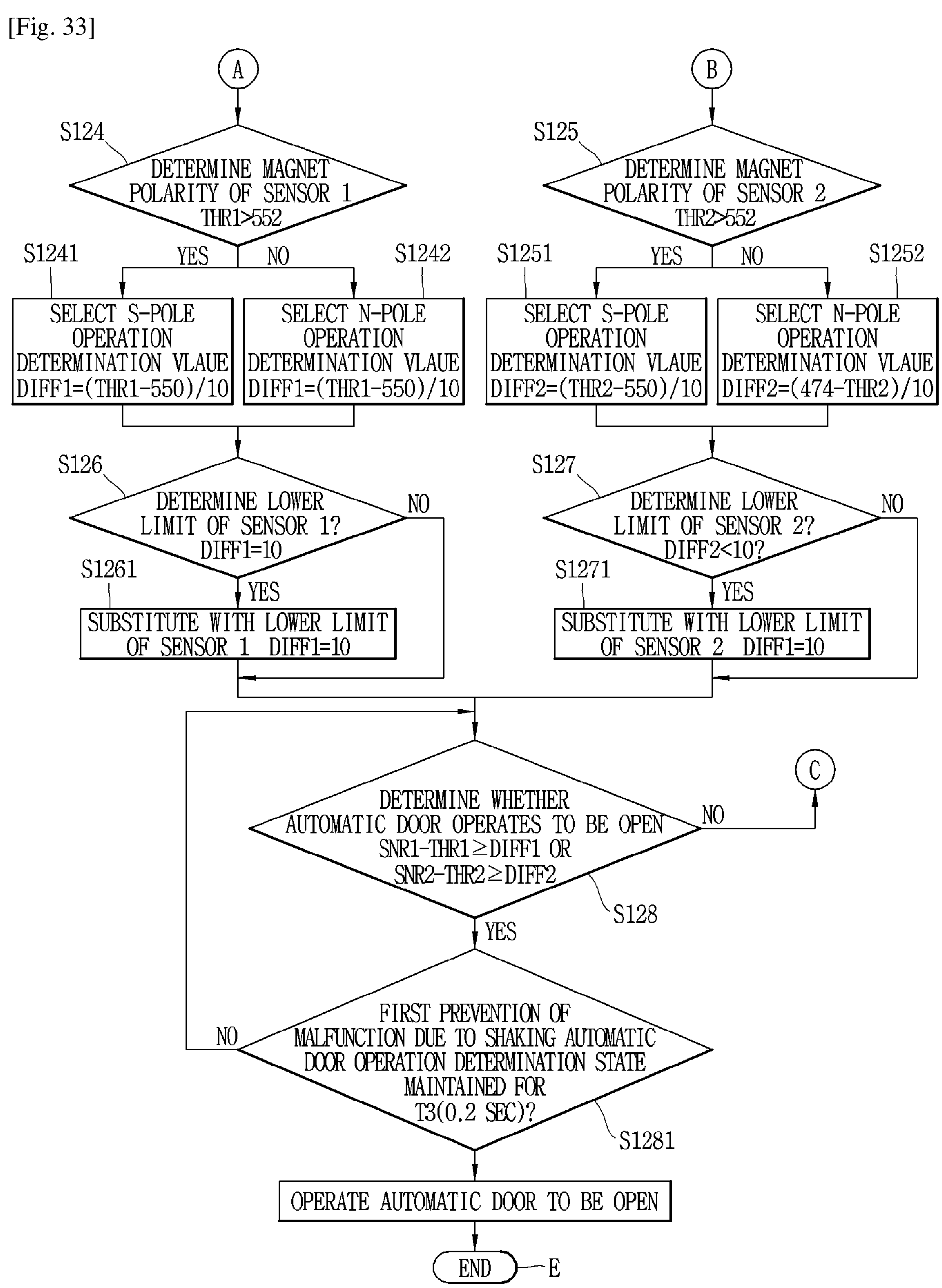

REFRIGERATOR WITH AUTOMATIC DOOR AND METHOD FOR CONTROLLING AUTOMATIC DOOR OF REFRIGERATOR

CROSS-REFERENCE TO RELATED APPLICATIONS

This application is a National Stage application under 35 U.S.C. § 371 of International Application No. PCT/KR2022/001894, filed Feb. 8, 2022, which claims the benefit of Korean Application No. 10-2021-0018421, filed on Feb. 9, 2021. The disclosures of the prior applications are incorporated by reference in their entirety.

TECHNICAL FIELD

The present disclosure relates to a refrigerator having an automatic door that is automatically open when the door is pressed, and a method for controlling the automatic door of the refrigerator.

BACKGROUND ART

A refrigerator is a home appliance that can keep foods at a low temperature in a storage container defined inside a main body.

In general, a refrigerator is configured to open and close a storage container by mounting a door on a main body. A user can open and close the door to put food in or take food out from the storage container.

External air introduced into the storage container is gradually cooled over time so as to be reduced in specific volume, and internal pressure of the storage container becomes lower than external pressure of the storage container.

For this reason, in order to open the door, a considerably large force is required to overcome a pressure difference between inside and outside of the storage container.

As a method for a user to easily open a door, Prior Art Document 1 (Patent Publication No. 10-2018-0132390) discloses a refrigerator capable of automatically opening a door using a drive motor when a user presses the door, and a method for controlling the door of the refrigerator.

According to Prior Art Document 1, a detection sensor may determine the user's intention by way of detecting a movement direction of a detection lever that is disposed at a front end portion of a main body to come in contact with the door, and distinguishing a push input and an external impact applied to the door according to the movement direction of the detection lever.

However, in Prior Art Document 1, in order to maintain the contact state between the detection lever and the door, the detection lever needs to protrude outward from the front end portion of the main body toward the door. This acts as a factor that spoils the design of the refrigerator.

In addition, as the door is repeatedly open and closed, the door and the detection lever are repeatedly brought into contact with each other, which causes problems such as deformation, deterioration, wear and the like of a contact portion between the door and the detection lever.

In addition, in the prior art refrigerator having the automatic door, malfunctions of the automatic door may occur due to various causes, such as recoil of the door when it is closed, mis-assembly of a magnet, a change in internal pressure of the refrigerator, external impacts, and the like.

DISCLOSURE OF INVENTION

Technical Problem

The present disclosure describes a refrigerator with an automatic door having a structure capable of solving those problems and other drawbacks, and a method for controlling the automatic door of the refrigerator.

The present disclosure also describes a refrigerator with a structure for mounting a magnet and a magnetic field sensor to a door and a main body, which is capable of protecting the magnet and the magnetic field sensor from external impacts and stably supporting the magnet and the magnetic field sensor in spite of a repeated opening and closing operation of the door, and a method for controlling the automatic door of the refrigerator.

The present disclosure further describes a refrigerator with an automatic door that is capable of detecting a pressed amount (degree or level) of the door even without a direct contact with the door, and a method for controlling the automatic door of the refrigerator.

The present disclosure further describes a refrigerator with an automatic door that is capable of making appearance of the refrigerator beautiful by virtue of absence of a contact-type detection sensor and preventing an occurrence of deformation, deterioration, wear, etc. of a contact portion due to a contact with the door, and a method for controlling the automatic door of the refrigerator.

The present disclosure further describes a refrigerator with an automatic door that is capable of more stably determining whether the automatic door is operating, and a method for controlling the automatic door of the refrigerator.

The present disclosure further describes a refrigerator with an automatic door that is capable of solving malfunction of the automatic door even when a main body and the door shake due to recoil of the door when it is closed, and a method for controlling the automatic door of the refrigerator.

The present disclosure further describes a refrigerator with an automatic door that is capable of solving malfunction of the automatic door even when a magnet is incorrectly assembled with polarities reversed, and a method for controlling the automatic door of the refrigerator.

The present disclosure further describes a refrigerator with an automatic door that is capable of solving malfunction of the automatic door even when internal pressure of the refrigerator changes, and a method for controlling the automatic door of the refrigerator.

The present disclosure further describes a refrigerator with an automatic door that is capable of solving malfunction of the automatic door even when a main body and the door shake due to external causes, and a method for controlling the automatic door of the refrigerator.

The present disclosure further describes a refrigerator with an automatic door that is capable of preventing the automatic door from being unintentionally open, which may occur when an excessively small operation determination value is selected, and a method for controlling the automatic door of the refrigerator.

Solution to Problem

In order to achieve those aspects and other advantages of the subject matter disclosed herein, a refrigerator may include a main body and a door. The main body may include an inner case defining a storage container, an outer case surrounding the inner case, and an insulator disposed between the inner case and the outer.

The door may be rotatably mounted to the main body to open and close the storage container.

The refrigerator may include a sensor unit, a door drive module, and a controller.

The sensor unit may include a magnet and a magnetic field sensor. The sensor unit may include a magnetic field sensor configured to output a voltage by measuring magnetic flux density according to a change in distance from the magnet. The sensor unit may be configured to detect whether the door is open or closed and a pressed amount of the door according to a change in distance between the main body and the door.

The door drive module may be mounted to an upper portion of the main body. The door drive module may drive the door to be open when the door is pressed.

The controller may control the door drive module. The controller may determine whether the door operates to be open according to the pressed amount of the door.

The controller may select an output voltage of the magnetic field sensor when the door is closed as a threshold value. The controller may select an operation determination value of the door according to the threshold value. The controller may compare the operation determination value with a preset operation determination lower limit. The controller may substitute the operation determination value with the operation determination lower limit when the operation determination value is smaller than the operation determination lower limit according to the comparison. The controller may determine whether the door operates to be open by comparing a difference between the output voltage and the threshold value with the operation determination value.

In one implementation, the controller may determine whether the door operates to be open by comparing the difference between the output voltage and the threshold value with the operation determination value when the operation determination value is equal to or greater than the operation determination lower limit.

In one implementation, the controller may make the door open when a state, in which the difference between the output voltage of the magnetic field sensor and the threshold value is equal to or greater than the operation determination value, is maintained for a first preset time for preventing malfunction due to shaking, and redetermine whether the door operates to be open when the state is not maintained for the first preset time.

In one implementation, the controller may determine whether the door operates to be open by comparing a difference between the output voltage of the magnetic field sensor when the door is pressed and the threshold value with the operation determination value. The controller may make the door open when the difference between the output voltage of the magnetic field sensor when the door is pressed and the threshold value is equal to or greater than the operation determination value. The controller may determine whether the door is open or closed when the difference between the output voltage when the door is pressed and the threshold value is smaller than the operation determination value.

In one implementation, the controller may compare the output voltage of the magnetic field sensor with a preset voltage value for determining whether the door is open or closed. The controller may determine that the door is closed when the output voltage is equal to or greater than the preset voltage value, and determine that the door is open when the output voltage is smaller than the preset voltage value.

In one implementation, the controller may compare a variation of an output voltage measured every preset time with a preset convergence determination voltage value when it is determined that the door is not open. The controller may determine that the output voltage converges when the variation of the output voltage is equal to or smaller than the convergence determination voltage value, and select the converged output voltage as the threshold value.

In one implementation, the controller may determine whether to save the threshold value when it is determined that the difference between the output voltage of the magnetic field sensor and the threshold value is smaller than the operation determination value. When a second preset time elapses from a time point at which it is determined whether to save the threshold value, the controller may compare a preset voltage value for preventing the malfunction due to shaking with a difference (abs(SNRa−SNRb)) between an output voltage SNRa, which is output when a third preset time shorter than the second preset time elapses from the time point at which it is determined whether to save the threshold value, and an output voltage SNRb, which is output when the second preset time elapses from the time point at which it is determined whether to save the threshold value. The controller may save the threshold value when the difference (abs(SNRa−SNRb)) between the output voltages is equal to or smaller than the preset voltage value for preventing the malfunction due to shaking, and update the threshold value when a fourth preset time elapses after saving the threshold value.

In one implementation, the magnetic field sensor may be implemented as an analog Hall sensor.

In one implementation, the magnet may have an S pole and an N pole. The magnet may be disposed to face the magnetic field sensor. The S pole may face the magnetic field sensor and the N pole may face an opposite direction to the magnetic field sensor.

In one implementation, the magnetic field sensor may be provided in plurality mounted to upper portion and lower portion of the main body, respectively, and the magnet may be provided in plurality mounted to upper portion and lower portion of the door, respectively.

In one implementation, the storage container may include a refrigerating chamber defined at one side in the main body, and a freezing chamber defined at another side in the main body. The door may include a refrigerating chamber door mounted to one side of the main body to open and close the refrigerating chamber, and a freezing chamber door mounted to another side of the main body to open and close the freezing chamber. The magnetic field sensor may be provided by one or in plurality on each of the one side and the another side of the main body. The magnet may be provided by one or in plurality on each of the refrigerating chamber door and the freezing chamber door to face the magnetic field sensor.

According to another implementation of the subject matter disclosed herein, a refrigerator may include a main body including an inner case defining a storage container, an outer case surrounding the inner case, and an insulator disposed between the inner case and the outer case, a door rotatably mounted to the main body to open and close the storage container, a door drive module mounted to an upper portion of the main body and configured to drive the door to be open when the door is pressed, a sensor unit comprising a magnet mounted to the main body and a magnetic field sensor mounted to the door, and configured to detect whether the door is open or closed and a pressed amount of the door according to a change in distance between the magnetic field sensor and the magnet, and a controller configured to control the door drive module and determine whether the door operates to be open according to the pressed amount of the door. The controller may select an output voltage of the magnetic field sensor when the door is closed as a threshold value. The controller may select an operation determination value of the door according to the threshold value. The controller may compare the operation determination value with a preset operation determination lower limit. The controller may substitute the operation determination value with the operation determination lower limit when the operation determination value is smaller than the operation determination lower limit. The controller may determine whether the door operates to be open by comparing a difference between the output voltage and the threshold value with the operation determination value.

According to one implementation of the subject matter disclosed herein, a method for controlling an automatic door of a refrigerator may be configured to control the automatic door of the refrigerator to be automatically open when pressed. The refrigerator may include a main body having a storage container therein, and a door rotatably mounted to the main body to open and close the storage container.

The automatic door control method may include periodically measuring an output voltage of a magnetic field sensor every preset time, the magnetic field sensor detecting magnetic flux density according to a change in distance between the magnetic field sensor mounted to the main body and a magnet mounted to the door, determining whether the door is open or closed by comparing the output voltage with a preset voltage value for determining whether the door is open or closed, selecting an output voltage at a time, at which it is determined that the door is closed, as a threshold value when it is determined that the door is closed, selecting an operation determination value of the door according to the threshold value, substituting the operation determination value with a preset operation determination lower limit when the operation determination value is smaller than the operation determination lower limit, determining whether the door operates to be open by comparing a difference between an output voltage measured when the door is pressed and the threshold value with the operation determination value, and operating the door to be open when the difference between the output voltage when the door is pressed and the threshold value is equal to or greater than the operation determination value.

In one implementation of the automatic door control method of the refrigerator, the determining whether the door operates to be open may include making the door open when a state, in which the difference between the output voltage of the magnetic field sensor and the threshold value is equal to or greater than the operation determination value, is maintained for a first preset time for preventing malfunction due to shaking, while redetermining whether the door operates to be open when the state is not maintained for the first preset time.

In one implementation of the automatic door control method of the refrigerator, the determining whether the door operates to be open may include determining whether to save the threshold value when the difference between the output voltage of the magnetic field sensor and the threshold value is smaller than the operation determination value. The determining whether to save the threshold value may include comparing, when a second preset time elapses from a time point at which it is determined whether to save the threshold value, a preset voltage value for preventing the malfunction due to shaking with a difference (abs(SNRa−SNRb)) between an output voltage SNRa, which is output when a third preset time shorter than the second preset time elapses from the time point at which it is determined whether to save the threshold value, and an output voltage SNRb, which is output when the second preset time elapses from the time point at which it is determined whether to save the threshold value, saving the threshold value when the difference (abs(SNRa−SNRb)) between the output voltages is equal to or smaller than the preset voltage value for preventing the malfunction due to shaking, and updating the threshold value when a fourth preset time elapses after saving the threshold value.

In one implementation of the automatic door control method of the refrigerator, the first preset time may be 0.2 seconds, the second preset time may be 2.0 seconds, the third preset time may be 1.9 seconds, and the fourth preset time may be 2 seconds.

In one implementation of the automatic door control method of the refrigerator, the determining whether the door is open or closed may be configured such that the door is determined to be in the closed state when the output voltage is greater than the preset voltage value while being determined to be in the open state when the output voltage is smaller than or equal to the preset voltage value.

In one implementation of the automatic door control method of the refrigerator, the determining whether the door is open or closed may further include determining whether the output voltage converges when the output voltage is greater than the preset voltage value. The determining whether the output voltage converges may include measuring an output voltage every preset time, sampling the output voltages each measured every preset time into steps each including a plurality of output voltages, determining that the output voltage converges when a variation of the sampled output voltages is equal to or smaller than a preset convergence determination voltage value, while determining that the output voltage does not converge when the variation of the sampled output voltages is greater than the convergence determination voltage value, and determining that the door is closed when the output voltage converges, while determining whether the door is open or closed when the output voltage does not converge.

In one implementation of the automatic door control method of the refrigerator, the selecting the threshold value may be configured to select an output voltage at a time, at which it is determined that the output voltage converges, as the threshold value when it is determined that the door is closed.

In one implementation of the automatic door control method of the refrigerator, the determining whether the door is open or closed may include stopping the determination as to whether the door operates to be open when it is determined that the door is open.

In one implementation of the automatic door control method of the refrigerator, the operation determination value may be calculated by an equation $$DIFF = \text{Slope}X\left(THR + \frac{Y - \text{intercept}}{\text{slope}}\right)$$

where the DIFF may denote the operation determination value, the THR may denote the threshold value, the slope may denote operation determination value change amount/ threshold value change amount, the y-intercept may denote a point where a y-axis representing the operation determination value meets a straight line of the equation, the slope may have a positive number smaller than 1, and the y-intercept may have a negative number.

In one implementation of the automatic door control method of the refrigerator, the slope may be 1/10 and the y-intercept may be −55.

In one implementation of the automatic door control method of the refrigerator, the magnetic field sensor may be provided in plurality mounted to upper portion and lower portion of the main body, respectively, and the magnet may be provided in plurality mounted to upper portion and lower portion of the door, respectively.

In one implementation of the automatic door control method for the refrigerator, the magnet may have an S pole and an N pole. The magnet may be disposed to face the magnetic field sensor. The S pole may face the magnetic field sensor and the N pole may face an opposite direction to the magnetic field sensor.

According to another implementation of the subject matter disclosed herein, there is provided a method for controlling an automatic door of a refrigerator that includes a main body having a storage container therein, and a door rotatably mounted to the main body to open and close the storage container, and is configured such that the door is automatically open when pressed. The method may include periodically measuring an output voltage of a magnetic field sensor every preset time, the magnetic field sensor detecting magnetic flux density according to a change in distance between the magnetic field sensor mounted to the main body and a magnet mounted to the door, determining whether the door is open or closed by comparing the output voltage with a preset voltage value for determining whether the door is open or closed, selecting an output voltage at a time, at which it is determined that the door is closed, as a threshold value when it is determined that the door is closed, determining a polarity of the magnet by comparing the threshold value with a magnet polarity determination voltage value, selecting a different operation determination value of the door for each polarity, substituting the operation determination value with a preset operation determination lower limit when the operation determination value is smaller than the operation determination lower limit, determining whether the door operates to be open by comparing a difference between an output voltage measured when the door is pressed and the threshold value with the operation determination value, and operating the door to be open when the difference between the output voltage when the door is pressed and the threshold value is equal to or greater than the operation determination value.

According to another implementation of the subject matter disclosed herein, there is provided a method for controlling an automatic door of a refrigerator that includes a main body having a storage container therein, and a door rotatably mounted to the main body to open and close the storage container, the door being automatically open when pressed. The method may include periodically measuring an output voltage of a magnetic field sensor every preset time, the magnetic field sensor detecting magnetic flux density according to a change in distance between a magnet mounted to the main body and the magnetic field sensor mounted to the door, determining whether the door is open or closed by comparing the output voltage with a preset voltage value for determining whether the door is open or closed, selecting an output voltage at a time, at which it is determined that the door is closed, as a threshold value when it is determined that the door is closed, selecting an operation determination value of the door according to the threshold value, determining whether the door operates to be open by comparing a difference between an output voltage measured when the door is pressed and the threshold value with the operation determination value, and making the door open when a state, in which a difference between the output voltage of the magnetic field sensor and the threshold value is equal to or greater than the operation determination value, is maintained for a first preset time for preventing malfunction due to shaking, while redetermining whether the door operates to be open when the state is not maintained for the first preset time.

Advantageous Effects of Invention

According to implementations of the present invention, the following effects can be provided.

First, a magnet module may be mounted to a door and a magnet may be accommodated in a space defined by a magnet housing and a magnet cover constituting the magnet module, so as to be protected from external impacts and stably supported.

Pressing protrusions of the magnet cover may press the magnet disposed on seating protrusions of the magnet housing, to restrict movement of the magnet in an up and down direction.

A stopper may block one side surface of the magnet accommodated in the magnet housing, thereby restricting movement of the magnet in a front and rear direction.

Left and right surfaces of the magnet housing may surround left and right surfaces of the magnet, thereby restricting movement of the magnet in a left and right direction.

A magnetic field sensor module may be mounted to the main body and a magnetic field sensor may be accommodated in a space defined by a sensor housing and a sensor cover constituting the magnetic field sensor module, so as to be protected from external impacts and stably supported.

A first magnetic field sensor module may be mounted to an upper portion of the main body, a first magnetic field sensor may be mounted on a first PCB, and the first PCB may be slidably coupled to a first sensor housing, such that the first PCB and the first magnetic field sensor can be restricted from moving in the up and down direction.

A stop protrusion and a plurality of support protrusions may protrude from the first sensor housing, to restrict the movement of the first PCB in the front and rear and left and right directions.

A plurality of mounting protrusions and a plurality of movement-limiting protrusions may protrude from the first sensor cover to restrict the movement of the first sensor housing in the up and down direction, the front and rear direction, and the left and right direction.

A second magnetic field sensor module may be mounted to a grill disposed on a lower portion of the main body, a second magnetic field sensor may be mounted to a second PCB, the second PCB may be slidably coupled to an inside of a second sensor housing. Accordingly, the second sensor cover can press the second PCB such that the second PCB and the second magnetic field sensor can be restricted from moving in the up and down direction, the front and rear direction, and the left and right direction.

A plurality of grill mounting portions may protrude from left and right surfaces of the second sensor housing, and thus a plurality of blades may be press-fitted between the plurality of grill mounting portions, such that the second sensor housing and the grill can be firmly coupled to each other.

The grill may be assembled to the main body by a support bar, the second sensor housing may be connected to the support bar by a support portion, and first support plates may be disposed on the support bar to be inclined in an intersecting direction with the blades.

Fixing members may protrude from the main body toward the grill, and first fixing plates of the fixing members may be coupled to the first support plates to overlap each other, such that the grill can be assembled with the main body.

Second, a magnetic field sensor may be mounted to the main body and a magnet may be mounted to the door, or conversely, the magnet may be mounted to the main body and the magnetic field sensor may be mounted to the door. The magnetic field sensor and the magnet may be disposed to face each other. The magnetic field sensor may output a voltage by detecting a change in magnetic flux density generated in the magnet. The magnetic flux density may increase as a distance between the magnetic field sensor and the magnet decreases. On the other hand, the magnetic flux density may decrease as the distance between the magnetic field sensor and the magnet increases. An output voltage of the magnetic field sensor may increase as it is closer to an S pole of the magnet and decrease as it is closer to an N pole of the magnet.

According to a method for controlling an automatic door according to the present disclosure, whether the door is open or closed may be determined so that the automatic door does not operate in an open state of the door.

The magnetic field sensor and the magnet may be spaced apart from each other in a non-contact state. It may be determined that the door is in the open state when the output voltage of the sensor is smaller than a voltage value for determining whether or not the door is open or closed. On the other hand, it may be determined that the door is in a closed state when the output voltage is equal to or greater than the voltage value for determining whether or not the door is open or closed.

It may be determined whether the door is operating in the closed state. For stable door operation determination, a threshold value and an automatic door operation determination value may be selected. A sensor output voltage when a door is closed may be selected as the threshold value.

The output voltage of the magnetic field sensor may always change due to sample deviation before the door is pressed or an environmental difference. Therefore, the operation determination value may be selected according to a threshold value without using fixed threshold value and operation determination value.

The door may be operated (open) when a difference between the output voltage of the sensor and the threshold value is equal to or greater than the operation determination value. On the other hand, when the difference between the output voltage of the sensor and the threshold value is smaller than the operation determination value, whether the door is open or closed may be checked and then the determination as to whether the automatic door is operating may be repeated. When a user manually opens and closes the door without operating the automatic door, a distance between the magnet and the sensor may change in the closed state of the door. Therefore, the open and closed states of the door may be checked repeatedly.

With this configuration, the magnetic field sensor can detect whether the door is open or closed and a pressed amount of the door in a non-contact manner with the magnet, thereby making appearance of the refrigerator more beautiful and preventing an occurrence of deformation, deterioration and wear of a contact portion due to a contact with the door, compared to the related art contact-type detection lever.

In addition, an output voltage of the sensor in the closed state of the door may be selected as a threshold value, a door operation determination value may be selected according to the threshold value, and a difference between the output voltage of the sensor and the threshold value may be compared with an operation determination value when the door is pressed, thereby stably determining the operation of the door.

Third, if a threshold value is selected when the change in the distance between the magnet and the sensor is unstable due to shaking of the door and the main body caused by recoil after closing the door, malfunction of the door may occur. By determining the door to be in the closed state when output voltages are maintained (converged) in a constant value upon determining whether the door is open or closed, malfunction of the door which may occur when a threshold value is selected to be higher or lower than an output voltage in a normal state can be solved.

Fourth, when the magnet is misassembled such that its N pole faces the magnetic field sensor, the output voltage of the magnetic field sensor may show a different reaction from a normal assembly. This may cause an error in determining whether the automatic door operates, and bring about the malfunction of the automatic door.

When it is determined that the door is in the closed state, polarity of the magnet may be determined according to a magnitude of an output voltage, and a method of selecting an operation determination value may change according to the polarity. The automatic door may operate when the change in the output voltage at a time that the door is pressed is equal to or greater than an operation determination value selected according to the polarity.

With this configuration, even if the magnetic field sensor detects any polarity of the poles of the magnet, whether the automatic door operates can be determined. In addition, even if the magnet is incorrectly assembled, the malfunction of the automatic door can be prevented.

Fifth, when an output voltage (SNR) of the magnetic field sensor more increases or decreases than a threshold value (THR) due to a change in internal pressure of the refrigerator even though the door is not pressed, malfunction may occur even without a user's contact.

In order to solve this problem, when an operation determination condition upon determining the operation of the automatic door after selecting an initial threshold value is not satisfied, namely, when a condition in which a difference between an output voltage and a threshold value is equal to or greater than an operation determination value of the automatic door is not satisfied, a controller may store a threshold value after a lapse of a predetermined time. The controller may update a threshold value after a lapse of a predetermined time, thereby solving the malfunction that occurs when the existing threshold value is not updated or the threshold value is immediately updated periodically.

Sixth, the door may be shaken due to an external factor such as opening and closing of adjacent furniture, a refrigerator door, or the like, which may cause the malfunction of the door.

According to a first implementation of a method for preventing malfunction of the door due to shaking, the automatic door may operate only when an operation determination state of the automatic door is maintained for a predetermined time, unexpected or unintentional opening of the door can be prevented even though an output voltage is instantaneously increased due to shaking of the door and the main body.

According to a second implementation of a method for preventing malfunction of the door due to shaking, a threshold value may be stored only when a change of a sensor output voltage (abs (SNRa−SNRb) value) after determining that the threshold value is stored is equal to or smaller than a predetermined value (A2: 5 AD) for a predetermined time (e.g., 0.1 second), thereby preventing the door from being unintentionally open even when the output voltage is instantaneously decreased due to shaking of the door and the main body.

Seventh, if a too small operation determination value is selected, unexpected opening that the automatic door is operated even by an insignificant change in output voltage due to an external factor without a user's pressing the door may occur.

Even if an operation determination value is less than an operation determination lower limit (e.g., 10 AD), the operation determination value may be substituted with the operation determination lower limit, thereby solving the problem that the door is unintentionally open due to selection of a too small operation determination value.

BRIEF DESCRIPTION OF DRAWINGS

FIG. 1 is a conceptual view illustrating a state in which one magnetic field sensor and one magnet are mounted to a main body and a door of a refrigerator, respectively, in accordance with one implementation.

FIG. 2 is a conceptual view illustrating a state in which two magnetic field sensors and two magnets are mounted to the main body and the door of the refrigerator, respectively, in accordance with another implementation.

FIG. 3 is a conceptual view illustrating a state in which a plurality of magnetic field sensors are mounted to the main body of the refrigerator in accordance with still another implementation.

FIG. 4 is a conceptual view illustrating a state in which the magnet is mounted to the door in FIG. 2.

FIG. 5 is an enlarged conceptual view illustrating a portion of the door to which the magnet is mounted in FIG. 4.

FIG. 6 is a conceptual view illustrating a magnet module by enlarging part VI in FIG. 5.

FIG. 7 is an exploded view illustrating a state in which the magnet is disassembled from a magnet housing in FIG. 6.

FIG. 8 is a cross-sectional view taken along the line VIII-VIII of FIG. 6.

FIG. 9 is a cross-sectional view taken along the line IX-IX of FIG. 6.

FIG. 10 is a conceptual view illustrating a state in which a plurality of magnetic field sensors are mounted to the main body in FIG. 2.

FIG. 11 is a rear view illustrating a state in which a first magnetic field sensor module is mounted to a first sensor cover in FIG. 10.

FIG. 12 is an exploded view illustrating a state in which the first magnetic field sensor module is disassembled from the first sensor cover in FIG. 11.

FIG. 13 is a conceptual view illustrating the first magnetic field sensor module of FIG. 12, viewed from the front.

FIG. 14 is an exploded view illustrating a state in which a grill is disassembled from the main body in FIG. 10.

FIG. 15 is a conceptual view illustrating a state in which a second magnetic field sensor module is disposed on the grill in FIG. 14.

FIG. 16 is a block diagram illustrating a control device for an automatic door according to the present disclosure.

FIG. 17 is a conceptual view illustrating relationship between an analog Hall sensor and a magnet according to the present disclosure.

FIG. 18 is a graph showing changes in output voltage of the sensor according to polarities of the magnet.

FIG. 19 is a conceptual view illustrating changes in distance between the magnetic field sensor and the magnet when the door is open, closed, and pressed.

FIG. 20 is a graph showing a magnitude of a sensor output voltage according to the change in the distance between the sensor and the magnet when the door is open and closed.

FIG. 21 is a flowchart illustrating a method (operation determination method) of controlling an automatic door using a single magnetic field sensor in accordance with one implementation.

FIG. 22 is a graph showing changes in sensor output voltage according to changes in distance between the magnet and the sensor.

FIG. 23 is a graph showing a change in distance sensitivity for each output voltage.

FIG. 24 is a graph showing the output voltage of the sensor when the door is open, closed, and pressed.

FIG. 25 is a graph showing a decrease in an operation determination value with respect to the same threshold value when only a y-intercept is changed in an equation of a door operation determination value.

FIG. 26 is a graph showing that the operation determination value has a negative value when only a slope is changed in the equation of the door operation determination value.

FIG. 27 is a graph for explaining a method of changing an actual slope in the equation of the door operation determination value.

FIG. 28 is a flowchart illustrating a method (operation determination method) of controlling an automatic door using a plurality of magnetic field sensors in accordance with another implementation.

FIG. 29 is a flowchart illustrating an automatic door control method (determination of an operation determination lower limit) in accordance with still another implementation.

FIG. 30 is a graph showing a change in operation determination value for each threshold value of Equations 1 and 2.

FIG. 31 is a graph showing a change in operation determination value for each threshold value reflecting selection of the operation determination lower limit.

FIGS. 32 and 33 are flowcharts illustrating an automatic door control method (determination of an operation determination lower limit) in accordance with still another implementation.

BEST MODE FOR CARRYING OUT THE INVENTION

Hereinafter, a refrigerator with an automatic door and a method for controlling the automatic door of the refrigerator according to implementations will be described in detail with reference to the accompanying drawings.

In the following description, in order to clarify the characteristics of the present disclosure, descriptions of some components will be omitted.

1. Definition of Terms

It will be understood that when an element is referred to as being "connected with" another element, the element can be connected with the another element or intervening elements may also be present.

In contrast, when an element is referred to as being "directly connected with" another element, there are no intervening elements present.

A singular representation used herein may include a plural representation unless it represents a definitely different meaning from the context.

A shell used herein may mean a housing or a main body of a compressor used.

The terms "front side", "rear side", "left", "right", "top (or upper side)" and "bottom (or lower side)" used herein will be understood with reference to a coordinate system illustrated in FIG. 1.

2. Description of Configuration of Refrigerator According to One Implementation

Hereinafter, each component of a refrigerator according to an implementation disclosed herein will be described with reference to the accompanying drawings.

The refrigerator may have a built-in structure that is built in a wall.

(1) Refrigerator

FIG. 1 is a conceptual view illustrating a state in which one magnetic field sensor 152 and one magnet 143 are mounted to a main body 100 and a door 120 of a refrigerator, respectively, in accordance with one implementation.

FIG. 2 is a conceptual view illustrating a state in which two magnetic field sensors 152 and 170 and two magnets 143 are mounted to the main body 100 and the door 120 of the refrigerator, respectively, in accordance with another implementation.

FIG. 3 is a conceptual view illustrating a state in which the plurality of magnetic field sensors 152 and 170 are mounted to the main body 100 of the refrigerator in accordance with still another implementation.

The refrigerator according to the implementation may include a main body 100, a door 120, a door drive module 123, a sensor unit 130, and a controller 192.

The main body 100 may include an inner case 102, an outer case 101, and an insulator 103.

The outer case 101 may define appearance of the refrigerator. The outer case 101 may define the appearance of upper, lower, rear, right, and left surfaces of the refrigerator. The door 120 provided on the front of the main body 100 may define the front surface of the refrigerator.

The inner case 102 may be disposed at an inner side of the outer case 101. The inner case 102 may define a storage container 104 for keeping foods at a low temperature. The outer case 101 may surround the inner case 102.

The insulator 103 may be disposed between the inner case 102 and the outer case 101. The insulator 103 may be generally formed of polyurethane foam. The insulator 103 may suppress heat from being transferred from a relatively hot outside to a relatively cold storage container 104.

In order to cool the storage container 104 of the refrigerator, a refrigeration cycle device including a compressor may be disposed in the refrigerator. The refrigeration cycle device may include a compressor, a condenser, an expander and an evaporator.

The evaporator may induce heat exchange between air and refrigerant to generator cool air in the storage container 104. Air may be circulated by a fan. The compressor may compress refrigerant into a state of high temperature and high pressure, and the compressed refrigerant may circulate along components of the refrigeration cycle device such as the evaporator.

The door 120 may be coupled to one side of the front of the main body 100 by a hinge so as to be rotatable with respect to the main body 100. The door 120 may open and close the storage container 104 of the refrigerator. A handle 121 may be provided at a left end portion of the front surface of the door 120. A user may manually open and close the door 120 by pulling or pushing the handle 121.

A gasket may be disposed between the door 120 and the main body 100. The gasket may be formed of a rubber material having elasticity. The gasket may be installed on an inner edge of the door 120 to seal a gap between the door 120 and the main body 100.

The main body 100 may include a refrigerating chamber 105 and a freezing chamber 106. The refrigerating chamber 105 and the freezing chamber 106 may be partitioned in a top-down direction or a left and right direction of the main body 100.

The door 120 may be provided in plurality. The plurality of doors 120 may include a refrigerating chamber door 120 mounted on the main body 100 to open and close the refrigerating chamber 105 and a freezing chamber door 120 mounted on the main body 100 to open and close the freezing chamber 106.

The door (doors) 120 may be open or closed by a user's manual operation or may be automatically open by an automatic door drive module 123 to be described later when the door 120 is pressed.

The door drive module 123 may be mounted at a left or right side of an upper end of the main body 100. In this implementation, the door drive module 123 may be disposed at the right side of the upper end of the main body 100.

The door drive module 123 may be disposed adjacent to a side edge on which the hinge is installed.

The door drive module 123 may include a drive motor producing power, a plurality of gears transmitting the power, and a push part.

The drive motor may supply power for opening the door 120 using electric energy.

The push part may push the door 120 to open the door 120.

A rack gear may be provided on one side of the push part.

The plurality of gears may be engaged with the rack gear.

The plurality of gears may be connected to the drive motor to transmit power to the push part through the rack gear.

The push part may be operated by the power transmitted to the rack gear, to push one side of a hinge assembly, such that the door 120 can be open.

With this configuration, when the user lightly presses one side of the door 120 even without applying a force to open the door 120, the door drive module 123 can automatically open the door 120 using electric energy.

(2) Control Device of Automatic Door 120

① Mounting Structure of Sensor Unit 130

FIG. 4 is a conceptual view illustrating a state in which the magnet 143 is mounted to the door 120 in FIG. 2.

Figure 5:
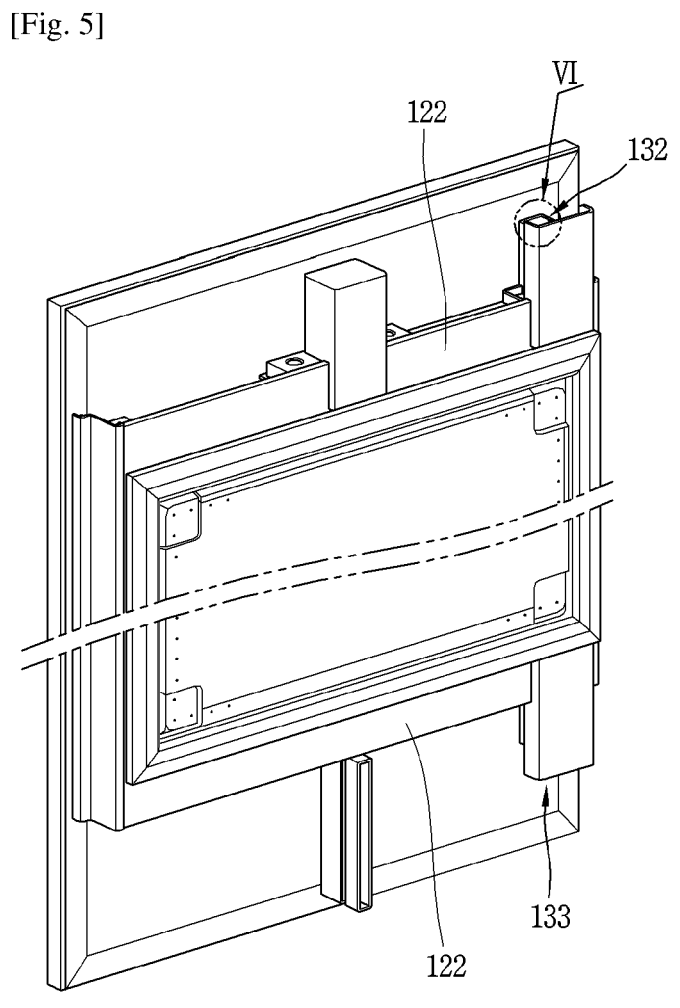

FIG. 5 is an enlarged conceptual view illustrating a portion of the door 120 to which the magnet 143 is mounted in FIG. 4.

Figure 6:
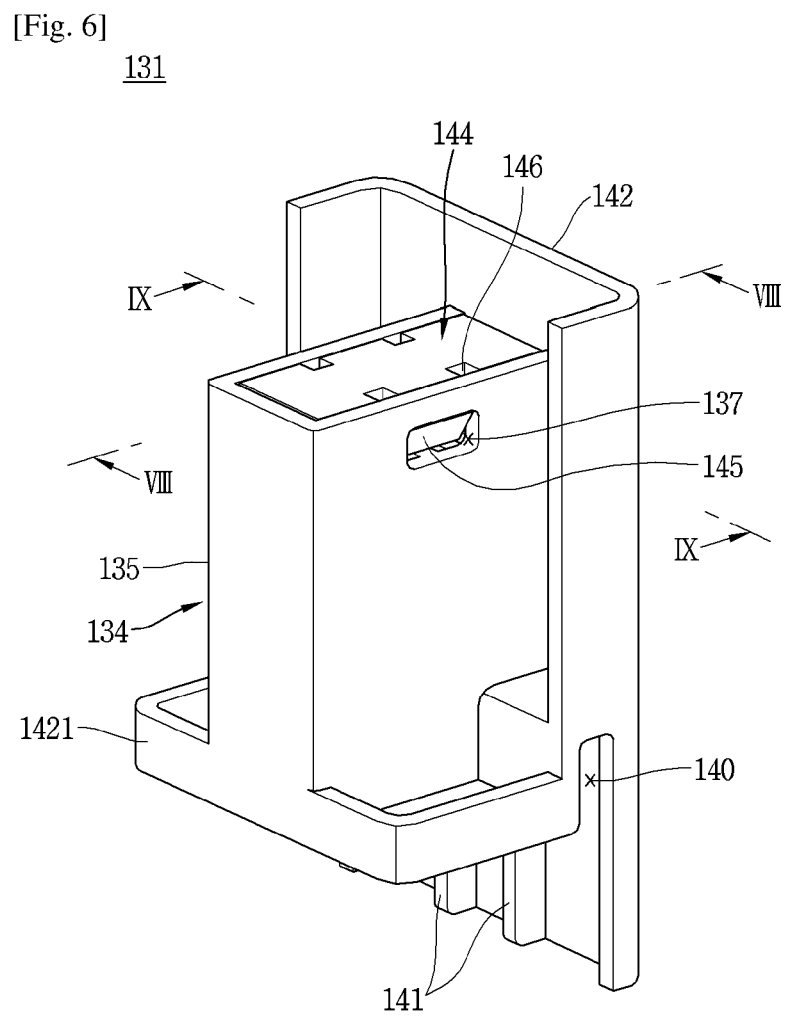

FIG. 6 is a conceptual view illustrating a magnet module 131 by enlarging part VI in FIG. 5.

FIG. 7 is an exploded view illustrating a state in which the magnet 143 is disassembled from a magnet housing 134 in FIG. 6.

FIG. 8 is a cross-sectional view taken along the line VIII-VIII of FIG. 6.

FIG. 9 is a cross-sectional view taken along the line IX-IX of FIG. 6.

The control device of the automatic door 120 may include a sensor unit 130, a controller 192 (see FIG. 27), and an automatic door drive module 123.

The sensor unit 130 and the door drive module 123 may be disposed at opposite sides to each other in the left and right direction of the main body 100. In this implementation, when viewed from the front of the refrigerator, the door drive module 123 may be disposed at a right end portion of the main body 100 and the sensor unit 130 may be disposed at a left end portion of the main body 100.

The sensor unit 130 may include a magnet 143 (permanent magnet) and a magnetic field sensor 152, 170.

The magnet 143 may be mounted to the door 120 and the magnetic field sensor 152 may be mounted to the main body 100, or the magnetic field sensor may be mounted to the door 120 and the magnet may be mounted to the main body 100.

This implementation illustrates an example in which the magnet 143 is mounted to the door 120 and the magnetic field sensor 152, 170 is mounted to the main body 100.

The magnet 143 and the magnetic field sensor 152, 170 may be disposed at upper end portions of the door 120 and the main body 100 to face each other in a front and rear direction when the door 120 is closed.

The magnet 143 may be provided by one (FIG. 1) or in plurality (FIG. 2) at the door 120.

The magnetic field sensor 152 may be provided by one (FIG. 1) or in plurality (FIG. 2) at the main body 100.

When the refrigerating chamber 105 and the freezing chamber 106 are partitioned in the left and right sides of the main body 100 (FIG. 3), the magnetic field sensor 152, 170 may be provided by one at each of the left and right sides of the main body 100 or may be provided in plurality at each of upper and lower portions of the left and right sides of the main body 100.

When the refrigerating chamber door 120 and the freezing chamber door 120 are separately provided on the main body 100 (not illustrated), the magnet 143 may be provided by one on each of the refrigerating chamber door 120 and the freezing chamber door 120 or may be provided in plurality on upper and lower portions of each of the refrigerating chamber door 120 and the freezing chamber door 120.

The magnetic field sensor 152 may be implemented as an analog Hall sensor. The analog Hall sensor may be a sensor whose output voltage varies depending on a magnitude of a magnetic field.

The magnetic field sensor 152 and the magnet 143 may be spaced apart from each other in the front and rear direction. The magnetic field sensor 152 may detect a change in magnitude of a magnetic field based on a change in distance from the magnet 143, thereby detecting a pressed amount (degree or level) of the door 120.

Since the plurality of magnetic field sensors 152 and 170 are installed in the upper and lower portions of the main body 100, a deviation in detecting the pressed amount of the door 120 can be reduced, compared to the single magnetic field sensor 152.

The magnet module 131 may be mounted to a rear surface of the door 120.

The magnet module 131 may include a first magnet module 132 and a second magnet module 133.

The first magnet module 132 may be disposed on an upper portion of the door 120, and the second magnet module 133 may be disposed on a lower portion of the door 120.

However, only one of the first magnet module 132 and the second magnet module 133 may be installed on the door 120. For example, only the first magnet module 132 may be installed on the upper portion of the door 120 or only the second magnet module 133 may be installed on the lower portion of the door 120 (not illustrated).

Since the first magnet module 132 and the second magnet module 133 have the same or similar configuration only with a difference in installation position at the door 120, the first magnet module 132 and the second magnet module 133 will be collectively referred to as the magnet module 131.

The magnet module 131 may include a magnet housing 134 and a magnet 143.

The magnet 143 may be formed in a shape of a rectangular bar. The magnet 143 may have a cross-sectional shape which is long and rectangular.

The magnet 143 may extend from the rear surface of the door 120 toward the inside of the main body 100 in the front and rear direction and may be horizontally disposed.

The magnet 143 may have an N pole 1432 and an S pole 1431. The magnet 143 may be disposed such that the S pole 1431 faces the magnetic field sensor 152 and the N pole 1432 faces an opposite direction to the magnetic field sensor 152.

The magnet housing 134 may accommodate the magnet 143.

The magnet housing 134 may include a first magnet housing 135 and a second magnet housing 142.

The first magnet housing 135 may include a magnet accommodating portion 136 therein. The magnet 143 may be accommodated in the magnet accommodating portion 136.

The first magnet housing 135 may be formed in a rectangular shape. The first magnet housing 135 may surround front, left, right, and lower surfaces of the magnet 143. Upper and rear surfaces of the first magnet housing 135 may be open.

The second magnet housing 142 may be formed to be larger than the first magnet housing 135. The second magnet housing 142 may cover the rear surface of the first magnet housing 135 and a rear surface of the magnet 143.

The first magnet housing 135 and the second magnet housing 142 may define the magnet accommodating portion 136.

Left and right surfaces of the second magnet housing 142 may be bent to cover portions of the side surfaces of the first magnet housing 135.

An extending portion 1421 may be disposed on a lower end portion of the second magnet housing 142.

The extending portion 1421 may extend from the lower end portion of the second magnet housing 142 to surround an outermost side of a lower end portion of the first magnet housing 135.

A front surface of the extending portion 1421 may be connected to the front surface of the first magnet housing 135, and left and right surfaces of the extending portion 1421 may protrude to overlap the side surfaces of the first magnet housing 135 in the left and right direction.

The extending portion 1421 may extend from the left and right surfaces of the second magnet housing 142 to define a rectangular box structure.

With this configuration, the extending portion 1421 can connect the first magnet housing 135 and the second magnet housing 142 by the rectangular box structure, thereby achieving a simple structure, withstanding external shocks, and improving durability.

A magnet cover 144 may be mounted on an upper portion of the first magnet housing 135. The magnet cover 144 may cover upper openings 177 (see FIG. 25) of the first magnet housing 135.

An inner surface of the upper portion of the first magnet housing 135 may surround edge portions of the magnet cover 144.

The magnet cover 144 may be fitted into the inner surface of the first magnet housing 135.

A plurality of locking protrusions 145 may be disposed on edge portions of the magnet cover 144.

The plurality of locking protrusions 145 may protrude downward from both sides of the magnet cover 144 toward the inside of the first magnet housing 135.

The locking protrusions 145 may be formed in a shape of a hook. Each of the locking protrusions 145 may have a lower end portion which is a free end and may be elastically supported on the magnet cover 144.

A plurality of elastic grooves 146 may be formed at portions of the magnet cover 144, to which upper end portions of the locking protrusions 145 are connected, to be concave (recessed) in the left and right direction of the magnet cover 144. The locking protrusions 145 can be more elastically bent toward the inner surface of the magnet cover 144 by the elastic grooves 146.

A plurality of locking holes 137 may be formed through the left and right surfaces of the first magnet housing 135. The locking holes 137 and the locking protrusions 145 may be disposed to face each other.

When the magnet cover 144 is fitted to cover the upper end portion of the first magnet housing 135, the locking protrusions 145 may be inserted into the locking holes 137, so that the magnet cover 144 can be coupled to the upper sides of the first magnet housing 135 and the second magnet housing 142.

With this configuration, the first and second magnet housings 142 and the magnet cover 144 can surround the magnet 143 accommodated in the magnet accommodating portion 136 in all directions, thereby protecting the magnet from external impacts.

A plurality of seating protrusions 138 may be formed at the magnet accommodating portion 136 of the first magnet housing 135. The magnet 143 may be seated on the plurality of seating protrusions 138.

The plurality of seating protrusions 138 may protrude upward from a bottom surface of the magnet accommodating portion 136 so as to come in contact with portions of a lower surface of the magnet 143. The seating protrusions 138 may have a rectangular cross-sectional shape and extend in an up and down direction. Each of the seating protrusions 138 may have an upper surface which is flat.

The plurality of seating protrusions 138 may be spaced apart from each other in a lengthwise direction of the magnet 143.

A stopper 139 may protrude upward in the magnet accommodating portion 136 of the first magnet housing 135. The stopper 139 may be spaced apart forwardly from the seating protrusion 138, which is located at an opposite side to the second magnet housing 142, of the plurality of seating protrusions 138.

The stopper 139 may be disposed to be contactable with the front surface of the magnet 143. An inner surface of the second magnet housing 142 may be disposed to be in contact with the rear surface of the magnet 143.

The magnet 143 seated on the plurality of seating protrusions 138 may be located between the stopper 139 and the inner surface of the second magnet housing 142.

With this configuration, the stopper 139 may restrict movement of the magnet 143 in the front and rear direction of the first magnet housing 135.

A plurality of pressing protrusions 147 may be disposed on an inner surface of the magnet cover 144. The plurality of pressing protrusions 147 may protrude downward from the inner surface of the magnet cover 144 to be in contact with portions of the upper surface of the magnet 143. The magnet 143 may be located between the pressing protrusions 147 and the seating protrusions 138.

The plurality of pressing protrusions 147 may be spaced apart from one another at a uniform interval in the lengthwise direction of the magnet 143.

When the magnet cover 144 is coupled to the first and second magnet housings 142 and 135, the plurality of pressing protrusions 147 may press the upper surface of the magnet 143.

With this configuration, the plurality of pressing protrusions 147 can suppress the magnet 143 seated on the seating protrusions 138 from moving up and down in the magnet accommodating portion 136 when the door 120 is closed or open.

The plurality of pressing protrusions 147 and the plurality of seating protrusions 138 may be alternately arranged on the upper and lower surfaces of the magnet 143 in the up and down direction without overlapping each other.

With this configuration, the plurality of pressing protrusions 147 can distribute a pressing force, which is applied to the upper surface of the magnet 143, uniformly in the lengthwise direction of the magnet 143, thereby maintaining a fixed state of the magnet 143.

On the other hand, in case where the pressing protrusions 147 and the seating protrusions 138 are disposed to overlap each other in the up and down direction, if the pressing force of the pressing protrusions 147 and a drag force of the seating protrusions 138 are excessively applied to the upper and lower surfaces of the magnet 143, the magnet 143 may be likely to be damaged.

Accordingly, when the magnet cover 144 and the first and second magnet housings 142 and 135 are assembled, such protrusions can minimize impacts transferred to the magnet 143 while maintaining the fixed state of the magnet 143.

Coupling grooves 140 may be formed in lower end portions of the first magnet housing 135 and the second magnet housing 142, respectively.

The coupling grooves 140 may extend upward from the lower end portions of the first magnet housing 135 and the second magnet housing 142, respectively. The coupling grooves 140 that are formed on the side surfaces of the second magnet housing 142 may extend to cross the lower portion of the first magnet housing 135 in the left and right direction.

A fixing bracket 122 for fixing the magnet 143 may be installed on an upper portion of a rear surface of the door 120. The fixing bracket 122 may protrude from the upper portion of the rear surface of the door 120 to be inserted into the coupling grooves 140.

With this configuration, since the fixing bracket 122 is inserted into the coupling grooves 140, the first and second magnet housings 142 and 135 can be coupled to the upper portion of the rear surface of the door 120.

A plurality of reinforcing ribs 141 may be disposed between the both coupling grooves 140.

The plurality of reinforcing ribs 141 may protrude from the inner surface of the second magnet housing 142 toward the fixing bracket 122.

The plurality of reinforcing ribs 141 may be spaced apart from each other in the left and right direction on the inner surface of the second magnet housing 142.

With this configuration, the plurality of reinforcing ribs 141 can improve rigidity of the second magnet housing 142.

When the fixing bracket 122 is inserted into the coupling grooves 140, the fixing bracket 122 can be press-fitted into the coupling grooves 140 along the plurality of reinforcing ribs 141 without a contact with the inner surface of the second magnet housing 142, which may result in improving close-coupling performance between the fixing bracket 122 and the magnet housing 134.

FIG. 10 is a conceptual view illustrating a state in which a plurality of magnetic field sensors 152 and 170 are mounted to the main body in FIG. 2.

FIG. 11 is a rear view illustrating a state in which the first magnetic field sensor module 150 is mounted to a first sensor cover 162 in FIG. 10.

FIG. 12 is an exploded view illustrating a state in which the first magnetic field sensor module 150 is disassembled from the first sensor cover 162 in FIG. 11.

FIG. 13 is a conceptual view illustrating the first magnetic field sensor module 150 of FIG. 12, viewed from the front.

A magnetic field sensor module 148 may include a first magnetic field sensor module 150 and a second magnetic field sensor module 168.

The first magnetic field sensor module 150 may be mounted to an upper portion of the main body 100. The second magnetic field sensor module 168 may be mounted to a lower portion of the main body 100.

However, only one of the first magnetic field sensor module 150 and the second magnetic field sensor module 168 may be mounted to the main body 100. For example, only the first magnetic field sensor module 150 may be disposed in the upper portion of the main body 100 or only the second magnetic field sensor module 168 may be disposed in the lower portion of the main body 100 (not illustrated).

A sensor accommodating portion 149 may be provided at an upper end portion of the front surface of the main body 100. The first magnetic field sensor module 150 may be installed in the sensor accommodating portion 149. The sensor accommodating portion 149 may be open to the front of the main body 100.

The first magnetic field sensor module 150 may include a first magnetic field sensor assembly 151, a first sensor housing 156, and a first sensor cover 162.

The first magnetic field sensor assembly 151 may include a first magnetic field sensor 152, a first Printed Circuit Board (PCB) 153, and a wire connector.

The first PCB 153 may be an electric/electronic component for operating the first magnetic field sensor 152. The first magnetic field sensor 152 may be mounted on the first PCB 153.

The first PCB 153 may include a first accommodating connector for connecting the wire connector. The wire connector may be inserted into the first accommodating connector. The first accommodating connector and the wire connector may be coupled by a hook coupling hole and a hook. A hook coupling hole may be formed at the first accommodating connector, and the hook may be formed at the wire connector to be coupled to the hook coupling hole.

The first sensor housing 156 may accommodate the first magnetic field sensor assembly 151. The first sensor housing 156 may be formed in a rectangular shape.

The first sensor housing 156 may have an accommodation space therein, to accommodate the first accommodating connector and the wire connector.

The first sensor housing 156 may be formed in a rectangular box shape. The first sensor housing 156 may surround upper and lower surfaces, a rear surface, and one side surface of the first accommodating connector. The first sensor housing 156 may have a front surface that is open.

A PCB mounting portion 157 may be disposed on the front surface of the first sensor housing 156. The PCB mounting portion 157 may protrude from upper and lower ends of the first sensor housing 156 to cover edges of the first PCB 153. The first PCB 153 may be slidably mounted to an inner side of the PCB mounting portion 157.

An inlet may be formed at one end portion of the PCB mounting portion 157. Accordingly, the first PCB 153 can be inserted into the PCB mounting portion 157 through the inlet.

A stop protrusion 158 may protrude from another end portion of the PCB mounting portion 157. The stop protrusion 158 may stop one end portion of the first PCB 153 to prevent the first PCB 153 from being slid out of the PCB mounting portion 157 in one side direction when the first PCB 153 is slid into the PCB mounting portion 157.

A plurality of support protrusions 159, 160, 161 may be provided on the PCB mounting portion 157. The plurality of support protrusions 159, 160, and 161 may support portions of a front surface of the first PCB 153.

The first support protrusion 159 among the plurality of support protrusions 159, 160, and 161 may protrude downward from an upper end portion of the PCB mounting portion 157 to support an upper end portion of the first PCB 153.

The second support protrusion 160 among the plurality of support protrusions 159, 160, and 161 may protrude upward from a lower end portion of the PCB mounting portion 157 to support a lower end portion of the first PCB 153.

The third support protrusion 161 among the plurality of support protrusions 159, 160, and 161 may protrude from the stop protrusion 158 to cover a right end portion of the first PCB 153.

With this configuration, the plurality of support protrusions 159, 160, and 161 may cover three portions of the first PCB 153 mounted to the PCB mounting portion 157, namely, the upper end portion, the lower end portion, and the right end portion of the first PCB 153, thereby preventing the first PCB 153 from being separated from the PCB mounting portion 157 to the outside of the first sensor housing 156.

The plurality of support protrusions 159, 160, and 161 and the stop protrusion 158 can suppress the first PCB 153 mounted to the PCB mounting portion 157 from moving back and forth and to right and left. This can minimize external vibration transmitted to the first PCB 153 and the first magnetic field sensor 152.

The first PCB 153 may be vertically disposed to cover a portion of the open front surface of the first sensor housing 156.

The first magnetic field sensor 152 may be disposed on the front surface of the first PCB 153 toward the first sensor cover 162.

A wire lead-in portion 1561 may be formed at one side of the first sensor housing 156. The wire lead-in portion 1561 may configured to lead the wire into the first sensor housing 156.

The wire lead-in portion 1561 may be formed in an arcuate shape.

A wire fixing protrusion 1562 may be provided at an inlet of the wire lead-in portion 1561. The wire fixing protrusion 1562 may protrude downward from an upper end of the wire lead-in portion 1561. A wire insertion opening 1563 may be defined between a lower end portion of the wire fixing protrusion 1562 and a lower end portion of the wire lead-in portion 1561.

Accordingly, the wire can be inserted between the wire fixing protrusion 1562 and the wire lead-in portion 1561 through the wire insertion opening 1563, so as to be fixed in the wire lead-in portion 1561 by the wire fixing protrusion 1562.

The first sensor cover 162 may be rotatably mounted on a front surface of the sensor accommodating portion 149 to open and close the open front surface of the sensor accommodating portion 149.

The first sensor cover 162 may be formed in a rectangular plate shape. The first sensor cover 162 may be long in the left and right direction. The first sensor cover 162 may be a larger than the first sensor housing 156 in size.

The first sensor housing 156 may be mounted on an inner surface of the first sensor cover 162. A plurality of mounting protrusions 163 may be provided on the inner surface of the first sensor cover 162. The plurality of mounting protrusions 163 may protrude from the inner surface of the first sensor cover 162 toward the inside of the sensor accommodating portion 149 so as to cover upper and lower edges of the PCB mounting portion 157.

The plurality of mounting protrusions 163 may be spaced apart from each other in the up and down direction and the left and right direction on the inner surface of the first sensor cover 162 to support four corners of the PCB mounting portion 157.

The plurality of mounting protrusions 163 may have a hook shape, and may cover a rear surface of the PCB mounting portion 157 so as to support the first sensor housing 156.

Since the plurality of mounting protrusions 163 are formed in a cantilever shape, the first sensor housing 156 may be elastically bent in the up and down direction when it is mounted on the first sensor cover 162.

For example, the plurality of mounting protrusions 163 having the hook shape may be spread out by the upper and lower surfaces of the PCB mounting portion 157 and then restored to their original positions when the first sensor housing 156 is mounted, thereby supporting the PCB mounting portion 157.

In addition, the plurality of mounting protrusions 163 may suppress the PCB mounting portion 157 from moving in the up and down direction on the inner surface of the first sensor cover 162 or from being separated backward.

A plurality of movement-limiting protrusions 164 and 165 may be disposed on the inner surface of the first sensor cover 162.

The first movement-limiting protrusion 164 of the plurality of movement-limiting protrusions 164 and 165 may protrude toward the inside of the sensor accommodating portion 149 to cover one side surface (left surface) of the PCB mounting portion 157.

The second movement-limiting protrusion 165 of the plurality of movement-limiting protrusions 164 and 165 may protrude toward the inside of the sensor accommodating portion 149 to cover one side surface (right surface) of the first PCB 153.

The plurality of movement-limiting protrusions 164 and 165 may be disposed at a middle portion between the plurality of mounting protrusions 163 spaced apart in the up and down direction. The plurality of movement-limiting protrusions 164 and 165 may be spaced apart from each other in a lengthwise direction of the PCB mounting portion 157.

With this configuration, the plurality of movement-limiting protrusions 164 and 165 can stop one side surface of the PCB mounting portion 157 and one side surface of the first PCB 153, respectively, so that the first sensor housing 156 can be prevented from moving in the left and right direction on the inner surface of the first sensor cover 162.

Accordingly, the plurality of mounting protrusions 163 and movement-limiting protrusions 164 and 165 can firmly maintain a fixed state of the first sensor housing 156 mounted on the first sensor cover 162.

The first sensor cover 162 may be disposed to cover the first PCB 153 and the first magnetic field sensor 152 to protect the first PCB 153 and the first magnetic field sensor 152 from external impacts.

A plurality of hinge portions 166 may be disposed on upper and lower portions of one side of the first sensor cover 162, respectively. The hinge portions 166 may be formed in a C-like shape or a hook shape. One side of each of the hinge portions 166 may be integrally formed with the first sensor cover 162. A hinge protrusion 1661 may protrude from another side of each of the hinge portions 166 in the up and down direction.

The hinge protrusions 1661 may serve as a central axis so that the first sensor cover 162 can rotate. The first sensor cover 162 may rotate in the front and rear direction centering on the hinge protrusions 1661.

The C-shaped or hook-shaped structure of the hinge portions 166 can avoid interference with the sensor accommodating portion 149 when one side of the first sensor cover 162 rotates centering on the hinge protrusions 1661.

A protruding portion 167 may protrude from the inner surface of the first sensor cover 162 toward the inside of the sensor accommodating portion 149 and extend along edges of the first sensor cover 162. One side of each of the hinge portions 166 may be connected to one end portion of the protruding portion 167.

The protruding portion 167 may be inserted into the inner surface of the sensor accommodating portion 149.

Upper and lower surfaces and one side surface of the protruding portion 167 may be disposed to overlap the inner surface of the sensor accommodating portion 149 in the up and down direction and the left and right direction when the first sensor cover 162 is closed.

With this configuration, the protruding portion 167 can firmly maintain the coupled state between the first sensor cover 162 and the sensor accommodating portion 149 when the first sensor cover 162 is closed, and prevent the first sensor cover 162 from shaking due to external impacts.

FIG. 14 is an exploded view illustrating a state in which a grill 113 is disassembled from the main body 100 in FIG. 10.

FIG. 15 is a conceptual view illustrating a state in which the second magnetic field sensor module 168 is disposed on the grill 113 in FIG. 14.

A machine room 107 may be defined in the lower portion of the main body 100. A compressor, a condenser, a fan, and the like may be installed in the machine room 107.

A plurality of frames 108 may be vertically disposed at both left and right sides of the machine room 107.

A plurality of support brackets 109 for fixing the grill 113 to the frames 108 may be provided.

The support brackets 109 may have a cross-section with a shape like "L". The support bracket 109 may be fixed to an edge of one side of each of the frames 108.

A plurality of fixing members 110 may protrude from each of the support brackets 109 toward the front of the frames 108.

Each of the plurality of fixing members 110 may include a first fixing member 111 and a second fixing member 112 that are disposed on the support bracket 109 to be spaced apart from each other in the up and down direction.

The first fixing members 111 may be connected to an upper portion of the grill 113. The second fixing members 112 may be connected to a lower portion of the grill 113. The first and second fixing members 111 and 112 may be formed in a plate shape.

The grill 113 may be disposed on the front of the frames 108. The grill 113 may be disposed vertically at the front of the machine room 107.

The first fixing members 111 may be connected to a plurality of first support plates 190 to be described later and the second fixing members 112 may be coupled to a connection bar to be described later, so as to support the grill 113.

The grill 113 may include a plurality of vertical plates 1131, 1132, and 1133, a plurality of blades 114, and a connection bar.

The plurality of vertical plates 1131, 1132, and 1133 which are formed in a plate shape may extend upward from a bottom surface of the machine room 107 and may be installed vertically.

The plurality of vertical plates 1131, 1132, and 1133 may be provided in three pieces. Among the plurality of vertical plates 1131, 1132, and 1133, the first vertical plate 1131 and the second vertical plate 1132 may be disposed at both left and right ends of the machine room 107, respectively, and the third vertical plate 1133 may be disposed at a middle portion between the first and second vertical plates 1131 and 1132.

The plurality of vertical plates 1131, 1132, and 1133 may extend in the front and rear direction of the machine room 107.

A front end and a rear end of each of the first vertical plate 1131 and the second vertical plate 1132 may be bent toward each other in the left and right direction. The first and second vertical plates 1131 and 1132 may have a cross-sectional shape like "U" and extend in the up and down direction.

The third vertical plate 1133 may have a cross-sectional shape like "H" and extend in the up and down direction.

The plurality of blades 114 may extend long in the left and right direction of the main body 100. The blades 114 may be formed in a plate shape. The blades 114 may be disposed to be inclined with respect to a vertical plane. A first edge portion may be provided on an upper side of each blade 114 and may extend horizontally with respect to an inclined surface of the blade 114. A second edge portion may be provided on a lower side of each blade 114 and may extend vertically with respect to the inclined surface of the blade 114.

The blade 114 may be inclined at a first inclination angle with respect to the first edge portion and inclined at a second inclination angle with respect to the second edge portion. The first inclination angle and the second inclination angle may be different from each other.

The plurality of blades 114 may be disposed between the adjacent vertical plates of the plurality of vertical plates 1131, 1132, and 1133, and both end portion of each blade 114 may be respectively coupled to the vertical plates.

The connection bar may be disposed beneath the plurality of vertical plates 1131, 1132, and 1133, to connect the plurality of vertical plates 1131, 1132, and 1133 in the left and right direction. The connection bar may have a cross-sectional shape like "U" with one side open, and extend long in the left and right direction of the main body 100.

Both end portions of the connection bar may be respectively coupled to the first vertical plate 1131 and the second vertical plate 1132 by coupling members such as screws. A lower end portion of the third vertical plate 1133 may be inserted into an insertion groove formed in a middle portion of the connection bar.

A plurality of second fixing plates 1121 may be formed on front end portions of the plurality of second fixing members 112 to be upwardly inclined with respect to a horizontal plane.

A plurality of coupling holes may be formed through the plurality of second fixing plates 1121.

A plurality of second support plates may be disposed on the connection bar. The plurality of second support plates may be upwardly inclined toward the front with respect to a horizontal plane of the connection bar.

A plurality of coupling holes may be formed through the second support plates.

The coupling holes of the second fixing plates 1121 and the coupling holes of the second support plates may overlap each other.

Coupling members such as screws may be coupled to the second fixing plates 1121 and the second support plates through the coupling holes of the second fixing plates 1121 and the coupling holes of the second support plates. Accordingly, the connection bar can be coupled to the second fixing plates 1121 through the second support plates so as to be supported thereby.

The plurality of blades 114 may be spaced apart from each other in the up and down direction of the vertical plates.

With this configuration, external air of the machine room 107 can be introduced into the machine room 107 or internal air of the machine room 107 can flow out of the machine room 107, through a gap between the blades 114.

The second magnetic field sensor module 168 may be mounted on the grill 113.

② Application of Sensor Unit 130

FIG. 16 is a block diagram illustrating a control device for an automatic door 120 according to the present disclosure.

FIG. 17 is a conceptual view illustrating relationship between an analog Hall sensor and the magnet 143 according to the present disclosure.

FIG. 18 is a graph showing changes in output voltage of the sensor according to polarities of the magnet 143.

FIG. 19 is a conceptual view illustrating changes in distance between the magnetic field sensor and the magnet 143 when the door is open, closed, and pressed.

FIG. 20 is a graph showing a magnitude of a sensor output voltage according to the change in the distance between the sensor and the magnet 143 when the door 120 is open and closed.

The S pole 1431 of the magnet 143 disposed at a distance from the magnetic field sensor in a direction facing the magnetic field sensor when the door 120 is closed, and the N pole 1432 of the magnet 143 may be disposed in an opposite direction to the magnetic field sensor.

Magnetic flux density of the magnet 143 may be increased toward each pole and decreased away from each pole (FIG. 17).

An output voltage of the magnetic field sensor may be increased closer to the S pole 1431 of the magnet 143 (FIG. 18). The output voltage of the magnetic field sensor may be decreased away from to the S pole 1431 of the magnet 143.

If the N pole 1432 of the magnet 143 is disposed to face the magnetic field sensor and the S pole 1431 of the magnet 143 is disposed in the opposite direction to the magnetic field sensor due to mis-assembly of the magnet 143, the output voltage of the magnetic field sensor may be decreased closer to the N pole 1432 of the magnet 143 when the door 120 is closed (FIG. 18). The output voltage of the magnetic field sensor may be increased away from the N pole 1432 of the magnet 143 (FIG. 18).

An analog Hall sensor may output both an analog signal and a digital signal.

When the door 120 is closed, a distance between the magnetic field sensor and the magnet 143 may be 6 mm.

When the door 120 is 10 mm apart from the main body 100, the distance GAP between the magnetic field sensor of the main body 100 and the magnet 143 of the door 120 may be 16 mm and the output voltage of the magnetic field sensor may be 552 AD.

In this specification, AD is an abbreviation of an analog to digital signal, which is a digitized voltage (analog) value. In this implementation, AD may digitize any voltage value in the range of 0 to 5V by 10 bits into 1024 steps.

AD can be expressed by an equation as follows.

$$AD = V \times 1024/5$$

For example, when an output voltage of a sensor is 5V, 5V may be converted into 1024 AD.

$$5V \rightarrow 5V \times 1024/5 = 1024\ AD$$

When an output voltage of a sensor is 3.5V, 3.5V may be converted into 717 AD.

$$3.5V \rightarrow 3.5V \times 1024/5 = 717\ AD$$

The output voltage 552 AD may be set to a threshold value for determining whether the door 120 is open or closed.

In general, when the door 120 is spaced apart from the main body 100 by 10 mm or more and a distance between the magnetic field sensor and the magnet 143 is 16 mm or more (GAP1), the output voltage of the magnetic field sensor may be lowered to 552 AD or less. This may be determined to be an open state of the door 120 (FIG. 19).

In general, when the door 120 is spaced apart from the main body 100 by 10 mm or less and a distance between the magnetic field sensor and the magnet 143 is 16 mm or less (GAP2), the output voltage of the magnetic field sensor may be higher than 552 AD. This may be determined to be a closed state of the door 120 (FIG. 31).

When the user presses the door 120 in the closed state of the door 120, the distance between the magnet 143 and the magnetic field sensor may be changed due to elasticity of the gasket provided between the door 120 and the main body 100. The magnetic field sensor may detect a change in the distance between the door 120 and the magnetic field sensor by detecting intensity of a magnetic field generated by the magnet 143.

When the door 120 is pressed, a distance GAP3 between the magnet 143 and the magnetic field sensor may be decreased to be shorter than the distance GAP2 between the magnet 143 and the magnetic field sensor when the door 120 is closed. At this time, the output voltage of the magnetic field sensor may be further increased.

In the case where the door 120 is not pressed any more, when an operating condition of the automatic door 120 is satisfied, the door 120 may be open by the door drive module 123. On the other hand, when the operating condition of the automatic door 120 is not satisfied, the distance between the magnet 143 and the magnetic field sensor may be restored to an original distance by the elastic force of the gasket. Accordingly, the output voltage of the magnetic field sensor can be more reduced than the output voltage when the door 120 is pressed.

The output voltage of the magnetic field sensor may vary depending on a change in distance between the door 120 and the magnetic field sensor.

The controller 192 may control the door drive module 123.

The controller 192 may be connected to the magnetic field sensor electrically/electronically or to perform communication, so as to receive a detection signal from the magnetic field sensor.

The controller 192 may be connected to the drive motor of the door drive module 123 electrically/electronically or to perform communication, so as to control the drive motor.

The controller 192 may receive a detection signal from the magnetic field sensor to detect whether the door 120 is open or closed and a degree (or level) that the door 120 is pressed (a pressed amount of the door 120).

(3) Method for Controlling Automatic Door 120

① One Implementation of Automatic Door Control Method (Operation Determination Method) Using One Magnetic Field Sensor 152

FIG. 21 is a flowchart illustrating a method (operation determination method) of controlling the automatic door 120 using the single magnetic field sensor 152 in accordance with one implementation.

FIG. 22 is a graph showing changes in output voltage of the sensor according to changes in distance between the magnet 143 and the sensor.

FIG. 23 is a graph showing a change in distance sensitivity for each output voltage.

FIG. 24 is a graph showing the output voltage of the sensor when the door 120 is open, closed, and pressed.

The controller 192 may determine whether or not the automatic door 120 operates to be open, that is, whether or not the door drive module 123 operates.

To this end, first, the magnetic field sensor 152 may periodically measure an output voltage SNR every preset time.

SNR: a current output voltage of the magnetic field sensor 152 (unit: AD)

The magnetic field sensor 152 may detect the S pole 1431 of the magnet 143. The output voltage of the sensor may decrease as the distance between the magnetic field sensor 152 and the S pole 1431 of the magnet 143 increases. The output voltage of the sensor may increase as the distance between the magnetic field sensor 152 and the S pole 1431 of the magnet 143 decreases.

The controller 192 may sense the change in the distance between the magnetic field sensor 152 of the main body 100 and the magnet 143 of the door 120 through the magnetic field sensor 152 in real time.

When the door 120 is not closed or is open, the controller 192 may check the open or closed state of the door 120 so that the automatic door 120 cannot operate (to be open).

The controller 192 may determine whether the door 120 is open or closed by detecting the output voltage of the magnetic field sensor 152 (S10).

For example, when the door 120 is in the closed state, the distance between the magnetic field sensor 152 and the S pole 1431 of the magnet 143 may decrease and the output voltage of the magnetic field sensor 152 may increase accordingly. When the output voltage of the magnetic field sensor 152 is greater than a preset value (a threshold value for determining whether the door 120 is open or closed; e.g., 552 AD), the controller 192 may determine that the door 120 is in the closed state (S11).

When the door 120 is not closed or open, the distance between the magnetic field sensor 152 and the S pole 1431 of the magnet 143 may increase and the output voltage of the magnetic field sensor 152 may decrease accordingly. When the output voltage of the magnetic field sensor 152 is equal to or less than the preset value, the controller 192 may determine that the door 120 is in the open state (S17).

In a fully closed state of the door 120, a gap GAP between the magnet 143 and the magnetic field sensor 152 may be 6.0 mm. When the gap is 6.0 mm, the output voltage may be 670 AD.

In FIG. 23, distance sensitivity may refer to an amount of change in output voltage each time when a gap GAP is changed by 0.5 mm. The unit of the distance sensitivity may be AD/0.5 mm. The unit of the output voltage may be AD.

The distance sensitivity may not be constant but be proportional to a magnitude of the output voltage.

Next, when it is determined that the door 120 is in the closed state, the controller 192 may stand by to detect the operation of the door 120 (S11).

In case where the user presses the door 120 to open, the controller 192 may control the door drive module 123 to open (operate) the automatic door 120 when the change in the output voltage of the magnetic field sensor 152 satisfies a specific condition.

For more stable operation determination of the automatic door 120, the controller 192 may select a threshold value THR for determining the operation of the automatic door 120 (S12).

THR: an automatic door operation threshold value of the magnetic field sensor 152

DIFF: an automatic door operation determination value of the magnetic field sensor 152

Here, the threshold value may be selected as an output voltage at a time when it is determined that the door 120 is in the closed state. The threshold value may be an output voltage (AD value) before the door 120 is pressed.

When the output voltage is 670 AD at a time at which it is determined that the door 120 is in the closed state, this value may be selected as a threshold value.

However, the output voltage of the sensor before the door 120 is pressed may always vary due to sample deviation or environmental difference.

Accordingly, the threshold value THR and the operation determination value DIFF may not be fixed but the operation determination value DIFF may be selected according to the threshold value THR (S13).

An equation for selecting the operation determination value of the automatic door 120 may be expressed as follows.

$$DIFF = (THR - 550)/10 \quad \text{[Equation 1]}$$

DIFF: an automatic door operation determination value (AD) and THR: a threshold value When the output voltage of the sensor is 670 AD at a time point at which it is determined that the door 120 is in the closed state before the door 120 is pressed, the threshold value may be 670 AD and the operation determination value may be (670−550)/10=12 AD.

Subsequently, the controller 192 may determine whether a difference between the threshold value and the output voltage is equal to or greater than the operation determination value (S14). The output voltage may be an output voltage measured by the magnetic field sensor 152 after the selection of the threshold value.

When it is determined that the difference between the threshold value and the output voltage is equal to or greater than the operation determination value, the controller 192 may operate the automatic door 120, that is, the door drive module 123.

For example, when the output voltage (unit: AD) is 685 AD and the threshold value is 670 AD at a time at which the door 120 is pressed, the difference between the output voltage and the threshold value may be 15 (=685−670) AD which is greater than the operation determination value of 12 AD. Therefore, the controller 192 may operate the door drive module 123 to open the door 120.

When the output voltage is 680 AD and the threshold value is 670 AD at a time that the door 120 is pressed, the difference between the output voltage and the threshold value may be 10 AD which is less than the operation determination value of 12 AD. Therefore, the controller 192 may not operate the automatic door 120 and redetermine whether the door 120 is open or closed (S16).

The repeated check of the open or closed state of the door 120 may result from that the distance between the magnet 143 and the sensor in the closed state of the door 120 is changed when the user manually opens or closes the door 120 without operating the automatic door 120.

Next, when it is determined that the door 120 is in the closed state, the process may go back to the step of selecting the automatic door operation determination value.

When it is determined that the door 120 is in the open state, the controller 192 may stop the detection of the operation of the automatic door 120 and the process may go back to the start (S) (S13).

FIG. 25 is a graph showing a decrease in an operation determination value with respect to the same threshold value when only a y-intercept is changed in an equation of the door operation determination value.

FIG. 26 is a graph showing that the operation determination value has a negative value when only a slope is changed in the equation of the door operation determination value.

FIG. 27 is a graph for explaining a method of changing an actual slope in the equation of the door operation determination value.

On the other hand, Equation 1 can be expressed by an equation of a straight line as follows.

Equation of Straight Line:

$$DIFF = \frac{1}{10} \times THR - 55$$

In an X-Y orthogonal coordinate system, the threshold value THR may be an X-axis component, and the operation determination value DIFF may be a Y-axis component. 1/10 may denote a slope, and −55 may denote a Y-intercept.

Referring to FIG. 25, when the Y-intercept is reduced from −55 to −60, the equation of the straight line may be DIFF=(THR−600)/10.

When the Y-intercept is reduced to −60, the operation determination value may be decreased, compared to an operation determination value before the Y-intercept changes, with respect to the same threshold value.

According to the calculation equation of the operation determination value, when the Y-intercept is smaller at the same slope, the operation determination of the automatic door 120 may be more sensitive.

However, as illustrated in FIG. 25, since the operation determination value is a negative number below the threshold value of 600 AD, a problem may occur in determining the operation of the automatic door 120.

In this implementation, when the output voltage of the sensor is less than 552 AD, the controller 192 may determine that the door 120 is in the open state and may not perform the operation determination of the automatic door 120. Therefore, such problem that the operation determination value is the negative number when applying Equation 1 may not be caused.

Referring to FIG. 26, when only the slope is reduced from 1/10 to 1/20 while maintaining the same Y-intercept of −55, the calculation equation of the operation determination value may be DIFF=(THR−1100)/20 and the operation determination value may have a negative number. This may cause a problem in determining the operation of the automatic door 120.

In this implementation, when the magnetic field sensor 152 detects the S pole 1431, an output voltage range of the sensor may be 550 AD or more.

Referring to FIG. 27, in this implementation, in order to adjust actual sensitivity to the operation determination of the door 120, a slope of a graph may be adjusted by changing "1/10" to "1/20" without changing the equation in parentheses as shown below. Accordingly, sensitivity to the operation determination of the door 120 can increase.

② One Implementation of Automatic Door Control Method (Operation Determination Method) Using Plural Magnetic Field Sensors 152 and 170

FIG. 28 is a flowchart illustrating a method (operation determination method) of controlling an automatic door using a plurality of magnetic field sensors 152 and 170 in accordance with another implementation.

This implementation is different from the implementations of FIGS. 21 to 24 in view of using the plurality of magnetic field sensors 152 and 170 to determine whether the automatic door 120 operates.

Since other configurations are the same as or similar to those of the implementation of FIGS. 21 to 24, repeated descriptions will be omitted and differences will be mainly described.

The plurality of magnetic field sensors 152 and 170 and the magnet 143 may be disposed in the main body 100 and the door 120, respectively. In this implementation, the two magnetic field sensors 152 and 170 and the two magnets 143 may be disposed in the upper and lower portions of the main body 100 and the door 120, respectively, in a direction facing each other.

In case of determining whether the door 120 is open or closed (S20), when output voltages SNR1 and SNR2 measured by the two magnetic field sensors 152 and 170 are all equal to or smaller than 552 AD, the controller 192 may determine that the door is in the open state (S27).

When at least one of the output voltages SNR1 and SNR2 is greater than 552 AD, the controller 192 may determine that the door 120 is in the closed state (S21).

- SNR1: a current output voltage of the first magnetic field sensor 152 (unit: AD)
- SNR2: a current output voltage of the second magnetic field sensor 170 (unit: AD)

Two threshold values THR1 and THR2 may be selected as the output voltages SNR1 and SNR2 at a time when the door 120 is determined to be in the closed state (S22).

- THR1: an automatic door operation threshold value of the first magnetic field sensor 152
- THR2: an automatic door operation threshold value of the second magnetic field sensor 170

Two automatic door operation determination values DIFF1 and DIFF2 may be selected by the following equations (S23).

$$DIFF1 = (THR1 - 550)/10$$

$$DIFF2 = (THR2 - 550)/10$$

- DIFF1: an automatic door operation determination value of the first magnetic field sensor 152
- DIFF2: an automatic door operation determination value of the second magnetic field sensor 170

When a difference between the output voltage SNR1, SNR2 of one of the two magnetic field sensors 152 and 170 and the threshold value THR1, THR2 is greater than or equal to the operation determination value DIFF1, DIFF2 (S24), the controller 192 may control the door drive module 123 to operate the automatic door 120, thereby opening the door 120 (S25).

When the difference between the output voltage SNR1, SNR2 of one of the two magnetic field sensors 152 and 170 and the threshold value THR1, THR2 is less than the operation determination values DIFF1, DIFF2, the controller 192 may redetermine whether the door 120 is open or closed (S26).

When it is determined that the door 120 is not in the open state, the process may go back to the step of selecting the operation determination value of the automatic door 120 (S23).

When it is determined that the door 120 is in the open state, the process may go back to the step of stopping the operation detection of the automatic door 120 and determining whether the door is open or closed (S20).

With this configuration, when determining whether the automatic door 120 operates by using the plurality of magnetic field sensors 152 and 170 and the magnets 143, the determination as to whether the automatic door 120 operates can be more sensitively carried out than that in the case using the single magnetic field sensor and the magnet 143.

Therefore, with the structure of mounting the magnet 143 in the door 120 and the magnetic field sensors 152 and 170 in the main body 100, the magnetic field sensors 152 and 170 can detect the magnet 143 mounted in the door 120. Accordingly, a pressed amount of the door 120 can be detected even without a direct contact with the door 120, and an outer design of the door can be more beautiful than the existing contact-type.

③ Another Implementation of Automatic Door Control Method (Determination of Operation Determination Lower Limit) Using One Magnetic Field Sensor 152

FIG. 29 is a flowchart illustrating an automatic door control method (determination of an operation determination lower limit) in accordance with still another implementation.

FIG. 30 is a graph showing a change in operation determination value for each threshold value of Equations 1 and 2.

FIG. 31 is a graph showing a change in operation determination value for each threshold value reflecting selection of the operation determination lower limit.

According to the previous implementation of FIGS. 21 to 28, when determining the operation of the automatic door 120 using the magnet 143 and the magnetic field sensor 152, the threshold value and the operation determination value may be selected. The threshold value may be an output voltage of the sensor after the door 120 is closed, and the operation determination value may be selected according to the threshold value.

In this case, the operation determination value may be selected using a table or a calculation equation. The calculation equation of the operation determination value may be expressed as follows according to the polarity of the magnet 143.

$$\text{S-Pole}: DIFF = (THR - 550)/10 \quad \text{[Equation 1]}$$

$$\text{N-Pole}: DIFF = (474 - THR)/10 \quad \text{[Equation 2]}$$

DIFF: the operation determination value of the automatic door 120 (AD) and THR: the threshold value (AD)

However, if a too small operation determination value is selected, unexpected opening that the automatic door is operated even by an insignificant change in output voltage due to an external factor without a user's pressing the door may occur.

For example, if the output voltage of the sensor is 560 AD after determining that the door 120 is closed, the threshold value THR may be 560 AD. By Equation 1, the operation determination value may be calculated as 1 AD (DIFF=(560−550)/10) (see FIG. 30).

Since this value corresponds to a small change that can be caused by noise, the automatic door 120 may erroneously operate even when the user does not press the door 120.

This implementation may be different from the previous implementation of FIGS. 21 to 28 in view of further performing a step of substituting the operation determination value for the S pole (1431) or the N pole 1432 with a preset operation determination lower limit when the operation determination value is equal to or smaller than the operation determination lower limit after selecting the operation determination value (S1141 and S1142).

For more stable operation determination of the automatic door 120, this implementation may further include an output voltage convergence determination (S111), a threshold value selection (S113), a magnet polarity determination (S114), an operation determination value selection (S1141 and S1142), a threshold value save (S1173), a threshold value update (S1175), first and second prevention of malfunction due to shaking (S118 and S1172). Since the threshold value selection S113 and the operation determination value selection S1141 and S1142 are the same as or similar to those of the previous implementation of FIGS. 21 to 28, redundant descriptions will be omitted.

However, in the output voltage convergence determination method, in order to solve a problem that an error in a selection of a threshold value occurs during a transient state of the output voltage of the magnetic field sensor, the output voltage may be measured every preset time T (e.g., 0.1 second) when the door 120 is closed. A preset number N (e.g., 5) of output voltages may be sampled for each step. In each step, when a variation of the output voltage for each preset time is smaller than or equal to a preset convergence determination voltage value A (e.g., ±5 AD), it may be determined that the output voltage converges. When the variation of the output voltage exceeds the convergence determination voltage value A, it may be determined that the output voltage does not converge (S111). When the output voltage does not converge, the process may go back to the step of determining whether the door is open or closed (S110).

A method of determining the polarity of the magnet 143 for each threshold value will be described as follows.

When the door 120 is closed, the threshold value may be compared with a voltage value for determining a polarity of the magnet (i.e., magnet polarity determination voltage value), for example, 552 AD (S114). When the threshold value exceeds 552 AD, the controller 192 may determine that the polarity of the magnet 143 is the S pole 1431 (S1141). The magnet polarity determination voltage value may be a value that is the same as an upper limit voltage value for determining whether the door 120 is open or closed.

In the closed state of the door 120, when the threshold value is 552 AD or less, the controller 192 may determine that the polarity of the magnet 143 is the N pole 1432 (S1142).

An operation determination value DIFF of the automatic door 120 for each polarity may be selected (S1141 and S1142).

Equations for selecting the automatic door operation determination value DIFF for each polarity are as follows.

$$S \text{ pole } 1431: DIFF = (THR - 550)/10 \quad \text{[Equation 1]}$$

$$N \text{ pole } 1432: DIFF = (474 - THR)/10 \quad \text{[Equation 2]}$$

DIFF: the operation determination value of the automatic door 120 (unit: AD) and THR: the threshold value (unit: AD)

The method of saving and updating the threshold value will be described as follows.

When the operation determination condition of the automatic door 120 is not satisfied after the initial threshold value is selected, a threshold value save determination may be carried out (S1171).

The threshold value save determination (S1171) may be carried out by determining whether two seconds have elapsed after it is determined that the operation determination condition of the automatic door 120 is not satisfied.

Then, after two seconds T2 elapses in the threshold value save determination (S1171), when a condition of the second prevention step (S952) for preventing the malfunction due to shaking, which will be described later, is satisfied, the output voltage SNR may be saved as the threshold value (S1173). When it is determined that two seconds have not elapsed in the threshold value save determination (S1171), it may be determined whether the door 120 is open or closed (S1176). In the determination as to whether the door 120 is open or closed (S1176), when the door is open, an operation detection of the automatic door 120 (detection of the pressed amount of the door 120) may be stopped (S1101) and the process may go back to the start (S). When the door 120 is closed, the process may go back to the magnet polarity determination (S114).

After saving the threshold value (S1173), a threshold value update determination may be performed (S1174).

The threshold value update determination (S1174) may be carried out by determining whether two seconds T2 have elapsed after the threshold value is saved.

When it is determined that two seconds have elapsed in the threshold value update determination (S1174), a previous threshold value may be updated to the saved threshold value. When it is determined that two seconds have not elapsed in the threshold value update determination (S1174), it may be determined whether the door 120 is open or closed (S1176). In the determination as to whether the door 120 is open or closed, when the door is open, the operation detection of the automatic door 120 may be stopped (S1101) and the process may go back to the start (S). When the door 120 is closed, the process may go back to the magnet polarity determination (S114).

Therefore, the threshold value save and the threshold value update may further be carried out when the operation determination condition, namely, the condition (SNR−THR≥DIFF) in which the difference between the output voltage and the threshold value is equal to or greater than the operation determination value of the automatic door 120 is not satisfied upon determining the operation of the automatic door 120 after selecting an initial threshold value. Also, the save and the update of the threshold value may be determined by determining whether two seconds have elapsed before the save and update of the threshold value. This can solve the problem that the automatic door malfunctions when a previous threshold value is not updated (CASE 1, CASE 2) or the threshold value is immediately updated periodically.

Reference numerals in FIG. 29 will be described as follows.

- SNR: a current output voltage of the sensor (unit: AD) (S110)
- T1: an output voltage sampling time (0.1 second) (S111)
- N: the number of samples for convergence determination (5 pieces) (S111)
- A1: a change amount of the output voltage of the sensor for convergence determination (±5 AD) (S111)
- THR: an automatic door operation threshold value of the sensor (S113)
- DIFF: an automatic door operation determination value of the sensor (S1141 and S1142)
- T2: a threshold value save or update time interval (two seconds) (S1171)
- SNRa: an output voltage of the sensor after lapse of 1.9 seconds (S1172)
- SNRa: an output voltage of the sensor after lapse of 2.0 seconds (S1172)
- SAVE: a value saved to update the threshold value (S1173)
- T3: a time of maintaining an automatic door operation determination state (0.2 seconds) (S118)

The first prevention of preventing the malfunction due to shaking may be a step of preventing the malfunction of the door that may occur due to an instantaneous increase in output voltage caused by shaking.

In the first prevention step of preventing the malfunction due to shaking, it may be determined whether an operation determination state of the automatic door 120 is maintained for a predetermined time T3 (e.g., 0.2 seconds) after the operation determination of the automatic door 120 is completed (S118).

The operation determination state of the automatic door 120 may mean a state of satisfying the condition (SNR−THR≥DIFF) that the difference between the output voltage SNR and the threshold value THR is equal to or greater than the operation determination value DIFF of the automatic door 120.

When the operation determination state of the automatic door 120 is maintained for a first preset time T3 (e.g., 0.2 seconds), the automatic door 120 may operate (to be open).

When the operation determination state of the automatic door 120 is not maintained for the first preset time, it may be redetermined whether the automatic door 120 operates to be open.

The second prevention (S1172) of preventing the malfunction due to shaking may be a step of preventing the malfunction of the door that may occur due to an instantaneous decrease in output voltage caused by shaking.

The second prevention step (S1172) of preventing the malfunction due to shaking may be carried out before the threshold value save (S1173) after the threshold value save determination (S951).

In the second prevention step of preventing the malfunction due to shaking, when a second preset time (e.g., 2.0 seconds) elapses from a time point at which it is determined whether to save the threshold value, it may be determined whether a difference between an output voltage SNRa, which is output when a third preset time (e.g., 1.9 seconds) shorter than the second preset time elapses from the time point at which it is determined whether to save the threshold value, and an output voltage SNRb, which is output when the second preset time (e.g., 2.0 seconds) elapses from the time point at which it is determined whether to save the threshold value, is equal to or greater than a preset voltage value A2 (e.g., 5 AD) for preventing the malfunction due to shaking (abs(SNRa−SNRb)≤A2) (S1172).

The time point at which it is determined whether to save the threshold value (S117) may be a time point at which it is determined that the difference between the output voltage SNR and the threshold value THR is smaller than the operation determination value DIFF (SNR−THR)<DIFF).

In abs(SNRa−SNRb)≤A2, abs may be abbreviation for an absolute value.

When the value of abs(SNRa−SNRb) is 5 AD (A2) or less, the threshold value may be saved (S1173).

When the value of abs(SNRa−SNRb) exceeds 5 AD, it may be redetermined whether the door 120 is open or closed without saving the threshold value (S1176).

Therefore, according to this implementation, in the first prevention step of preventing the malfunction due to shaking, the automatic door 120 can operate to be open only when the operation determination state of the automatic door 120 is maintained for a predetermined time. This can prevent the door 120 from being unexpectedly open even though the output voltage is instantaneously increased due to shaking of the door 120 and the main body 100.

Also, in the second prevention step of preventing the malfunction due to shaking, the threshold value can be saved only when the change in (the difference between) the output voltages (the value of abs (SNRa−SNRb)) after determining whether to save the threshold value is equal to or smaller than the predetermined value A2 (e.g., 5 AD) for a predetermined time (e.g., 0.1 second). This can prevent the door 120 from being unexpectedly open even though the output voltage is instantaneously decreased due to shaking of the door 120 and the main body 100.

In this implementation, after determining the polarity of the magnet 143 (S114), the operation determination value for the S pole 1431 or the N pole 1432 may be calculated using Equations 1 and 2 described above (S1141 and S1142).

Next, the calculated operation determination value may be compared with a preset operation determination lower limit (S115).

When the operation determination value is smaller than the preset operation determination lower limit, the operation determination value may be substituted with the preset operation determination lower limit (S116). Then, whether the automatic door 120 operates to be open may be determined by comparing the difference between the output voltage and the threshold value with the substituted operation determination value (S117).

When the operation determination value is equal to or greater than the preset operation determination lower limit, whether the automatic door 120 operates to be open may be determined by comparing the difference between the output voltage and the threshold value with the operation determination value (S117).

In this implementation, the operation determination lower limit may be set to 10 AD. In this case, even if the calculated operation determination value is smaller than 10 AD, the operation determination value may be substituted with 10 AD (see FIG. 31).

However, the operation determination lower limit may not be limited thereto, and may be adjusted according to an external environment, a size of the refrigerator, or a user's request.

For example, if the operation determination lower limit is smaller than 10 AD, the automatic door 120 may operate to be open even by a relatively small pressed amount of the door 120, thereby improving sensitivity of the automatic door 120.

If the operation determination lower limit is greater than 10 AD, the automatic door 120 may be driven to be open only by a relatively larger pressed amount of the door 120, and thereby the door 120 may become insensitive.

When the operation determination value is equal to or greater than the preset operation determination lower limit, the automatic door operation determination may be performed.

Therefore, according to this implementation, even if the operation determination value is smaller than the operation determination lower limit, the operation determination value may be substituted with the operation determination lower limit of 10 AD, thereby solving the problem that the door is unintentionally open due to selection of a too small operation determination value.

④ Another Implementation of Automatic Door Control Method (Determination of Operation Determination Lower Limit) Using Plural Magnetic Field Sensors 152 and 170

FIGS. 32 and 33 are flowcharts illustrating an automatic door control method (determination of an operation determination lower limit) in accordance with still another implementation.

This implementation may be different from the previous implementation of FIG. 29 in that the operation determination of the automatic door 120 is carried out using the plurality of magnetic field sensors 152 and 170 and the plurality of magnets 143.

However, since this implementation is the same or similar to the previous implementation of FIG. 29 in view of preventing unexpected opening of the door 120 due to selecting a too small operation determination value, redundant descriptions will be omitted.

Reference numerals in FIGS. 32 and 33 will be described as follows.

SNR1: a current output voltage of the first magnetic field sensor 152 (unit: AD) (S120)

SNR2: a current output voltage of the second magnetic field sensor 170 (unit: AD) (S120)

T1: an output voltage sampling time (0.1 second) (S121)

N: the number of samples for convergence determination (5 pieces) (S121)

A: a change amount of the output voltage of the sensor for convergence determination (±5 AD) (S121)

THR1: an automatic door operation threshold value of the first magnetic field sensor 152 (S123)

THR2: an automatic door operation threshold value of the second magnetic field sensor 170 (S123)

DIFF1: an automatic door operation determination value of the second magnetic field sensor 170 (S1241 and S1242)

DIFF2: an automatic door operation determination value of the second magnetic field sensor 170 (S1251 and S1252)

T2: a threshold value save and update time interval (two seconds) (S1281)

SNR1*a*: an output voltage of the first magnetic field sensor when 1.9 seconds elapse (S1282)

SNR1*b*: an output voltage of the first magnetic field sensor when 2.0 seconds elapse (S1282)

SNR2*a*: an output voltage of the second magnetic field sensor when 1.9 seconds elapse (S1282)

SNR2*b*: an output voltage of the second magnetic field sensor when 2.0 seconds elapse (S1282)

SAVE1: a value saved for updating the threshold value of the first magnetic field sensor 152 (S1283)

SAVE2: a value saved for updating the threshold value of the second magnetic field sensor 170 (S1283)

T3: a time of maintaining an automatic door operation determination state (0.2 seconds) (S1281)

In FIGS. 32 and 33, ⓐ may denote S123 and S124 are connected, ⓑ may denote S123 and S125 are connected, and ⓒ may denote S128 and S1281 are connected.

The implementation has been described as including those steps of the output voltage convergence determination, the threshold value selection, the magnet polarity determination, the operation determination value selection, the threshold value save and update, the first and second preventions for preventing the malfunction due to shaking, and the operation determination lower limit determination and substitution. However, those steps may be selectively applied and at least two of those steps may be combined to perform the operation determination of the automatic door 120.

The invention claimed is:

1. A refrigerator comprising:

a main body including an inner case defining a storage container, an outer case surrounding the inner case, and an insulator disposed between the inner case and the outer case;

a door rotatably coupled to the main body and configured to open and close the storage container;

a door driver disposed at an upper portion of the main body and configured to, based on the door being pressed, open the door;

a sensor comprising a magnetic field sensor and a magnet and configured to detect an open or closed state of the door and measure a pressed amount of the door based on a change in a distance between the magnetic field sensor and the magnet; and a controller configured to control the door driver and determine whether the door is to be opened based on the pressed amount of the door, wherein the controller is configured to:

select, as a threshold value, an output voltage of the magnetic field sensor based on the door being closed, calculate an operation determination value based on an equation that obtains the operation determination value by multiplying a slope by a sum of the threshold value and a quotient of a y-intercept divided by the slope, the slope being a positive number less than 1 and denoting operation determination value change amount/threshold value change amount, and the y-intercept being a negative number and denoting a point where a y-axis representing the operation determination value meets a straight line of the equation, compare the operation determination value with a preset operation determination lower limit, substitute, based on the calculated operation determination value being less than the operation determination lower limit, the operation determination value with the operation determination lower limit, and determine whether the door is to be opened by comparing (i) a difference between the output voltage and the threshold value with (ii) the substituted operation determination value, and wherein the difference between the output voltage and the threshold value is compared with the operation determination value to determine, based on the operation determination value being equal to or greater than the operation determination lower limit, whether the door is to be opened.

2. The refrigerator of claim 1, wherein the controller is configured to:

control the door driver to open the door based on a state being maintained for a first preset time, and determine, based on the state not being maintained for the first preset time, whether the door is to be opened, wherein the difference between the output voltage of the magnetic field sensor and the threshold value is equal to or greater than the operation determination value in the state.

3. The refrigerator of claim 1, wherein the controller is configured to:

determine whether the door is to be opened by comparing (i) a difference between an output voltage of the magnetic field sensor when the door is pressed and the threshold value with (ii) the operation determination value, control, based on the difference being equal to or greater than the operation determination value, the door driver to open the door open, determine, based on the difference being less than the operation determination value, whether the door is opened or closed, compare the output voltage of the magnetic field sensor with a preset voltage value to determine whether the door is open or closed, determine, based on the output voltage being equal to or greater than the preset voltage value, that the door is closed, and determine, based on the output voltage being less than the preset voltage value, that the door is opened.

4. The refrigerator of claim 1, wherein the controller is configured to:

based on a determination that the door is closed, compare a variation of an output voltage measured every preset time with a preset convergence determination voltage value, based on a determination that the variation of the output voltage is less than the convergence determination voltage value, determine that the output voltage converges, and select the converged output voltage as the threshold value.

5. The refrigerator of claim 1, wherein the controller is configured to:

based on a determination that the difference is less than the operation determination value, determine whether to save the threshold value, compare, based on a second preset time being elapsed from a time point at which it is determined whether to save the threshold value, a preset voltage value with a difference between a first output voltage and a second output voltage, the first output voltage being output when a third preset time less than the second preset time elapses from the time point at which it is determined whether to save the threshold value, and the second output voltage being output when the second preset time elapses from the time point at which it is determined whether to save the threshold value, based on the difference being equal to or less than the preset voltage value, save the threshold value, and based on a fourth preset time being elapsed after saving the threshold value, update the threshold value.

6. The refrigerator of claim 1, wherein the magnetic field sensor is disposed at the main body and the magnet is disposed at the door, and wherein the magnetic field sensor is an analog Hall sensor.

7. The refrigerator of claim 1, wherein the magnet has a first pole and a second pole, and wherein the magnet faces the magnetic field sensor, the first pole facing the magnetic field sensor and the second pole facing an opposite direction relative to the magnetic field sensor.

8. The refrigerator of claim 1, wherein the magnetic field sensor is disposed at the main body and the magnet is disposed at the door, wherein the magnetic field sensor is provided in plurality, the plurality of magnetic field sensors being disposed at an upper portion and a lower portion of the main body, respectively, and wherein the magnet is provided in plurality, the plurality of magnets being disposed at an upper portion and a lower portion of the door, respectively.

9. The refrigerator of claim 1, wherein the storage container comprises:

a refrigerating chamber defined at a first side of the main body, and a freezing chamber defined at a second side of the main body, wherein the door comprises:

a refrigerating chamber door coupled to the first side of the main body and configured to open and close the refrigerating chamber, and a freezing chamber door coupled to the second side of the main body and configured to open and close the freezing chamber, wherein the magnetic field sensor is provided as a single sensor or in plurality on each of the first side and the second side of the main body, and wherein the magnet is provided as a single magnet or in plurality on each of the refrigerating chamber door and the freezing chamber door to face the magnetic field sensor.

10. The refrigerator of claim 1, wherein the magnetic field sensor is disposed at the door and the magnet is disposed at the main body.

11. A method for controlling an automatic door of a refrigerator that comprises a main body having a storage container therein, a door rotatably coupled to the main body to open and close the storage container, and a door driver configured to, based on the door being pressed, automatically open the door, the method comprising:

periodically measuring an output voltage of a magnetic field sensor every preset time, the magnetic field sensor configured to detect magnetic flux density according to a change in a distance between the magnetic field sensor and a magnet;

determining whether the door is opened or closed by comparing the output voltage with a first preset voltage value;

selecting an output voltage at a time at which it is determined that the door is closed, as a threshold value;

calculating an operation determination value based on an equation that obtains the operation determination value by multiplying a slope by a sum of the threshold value and a quotient of a y-intercept divided by the slope, the slope being a positive number less than 1 and denoting operation determination value change amount/threshold value change amount, and the y-intercept being a negative number and denoting a point where a y-axis representing the operation determination value meets a straight line of the equation;

substituting, based on the calculated operation determination value being less than a preset operation determination lower limit, the operation determination value with the preset operation determination lower limit;

determining whether the door is to be opened by comparing (i) a difference between an output voltage measured when the door is pressed and the threshold value with (ii) the operation determination value; and opening the door based on the difference being equal to or greater than the operation determination value.

12. The method of claim 11, wherein determining whether the door is to be opened comprises controlling the door driver to open the door open based on a state being maintained for a first preset time, while performing a determination on whether the door is to be opened based on the state not being maintained for the first preset time, wherein the difference between the output voltage of the magnetic field sensor and the threshold value is equal to or greater than the operation determination value.

13. The method of claim 12, wherein determining whether the door is to be opened comprises determining whether to save the threshold value based on the difference being less than the operation determination value, wherein determining whether to save the threshold value comprises:

comparing, based on a second preset time being elapsed from a time point at which it is determined whether to save the threshold value, a second preset voltage value with a difference between a first output voltage and a second output voltage, the first output voltage being output when a third preset time less than the second preset time elapses from the time point at which it is determined whether to save the threshold value, and the second output voltage being output when the second preset time elapses from the time point at which it is determined whether to save the threshold value;

saving the threshold value based on the difference being equal to or less than the second preset voltage value; and updating the threshold value based on a fourth preset time being elapsed after saving the threshold value.

14. The method of claim 11, wherein determining whether the door is opened or closed is configured such that the door is determined to be closed based on the output voltage being greater than the first preset voltage value, and determined to be opened based on the output voltage being less than or equal to the first preset voltage value, and wherein determining whether the door is opened or closed comprises stopping the determination as to whether the door is opened when it is determined that the door is opened.

15. The method of claim 11, wherein determining whether the door is opened or closed further comprises determining whether the output voltage converges based on the output voltage being greater than the first preset voltage value, and wherein determining whether the output voltage converges comprises:

measuring an output voltage every preset time, sampling the output voltages each measured every preset time into steps each including a plurality of output voltages, determining that the output voltage converges based on a variation of the sampled output voltages being equal to or less than a preset convergence determination voltage value, determining that the output voltage does not converge based on the variation of the sampled output voltages being greater than the convergence determination voltage value, determining that the door is closed based on the output voltage being converged, and determining whether the door is opened or closed when the output voltage does not converge, and wherein selecting the threshold value comprises selecting an output voltage at a time at which it is determined that the output voltage converges, as the threshold value based on a determination that the door is closed.

16. The method of claim 11, wherein the slope is $1/10$ and the y-intercept is −55.

17. The method of claim 11, wherein the magnet has a first pole and a second pole, and wherein the magnet faces the magnetic field sensor, the first pole facing the magnetic field sensor and the second pole facing an opposite direction relative to the magnetic field sensor.

18. The method of claim 11, further comprising:

after selecting the output voltage as a threshold value and before selecting the operation determination value of the door, determining a polarity of the magnet by comparing the threshold value with a magnet polarity determination voltage value; and selecting a different operation determination value of the door for each polarity.

19. The method of claim 11, wherein the magnetic field sensor is disposed at the door and the magnet is disposed at the main body.

* * * * *